(12) United States Patent
Bean et al.

(10) Patent No.: US 9,537,284 B2
(45) Date of Patent: Jan. 3, 2017

(54) SEMICONDUCTOR LASER ASSEMBLY AND PACKAGING SYSTEM

(71) Applicant: SemiNex Corporation, Peabody, MA (US)

(72) Inventors: David M. Bean, Middleton, MA (US); John J. Callahan, Wilmington, MA (US)

(73) Assignee: SemiNex Corporation, Peabody, MA (US)

( * ) Notice: Subject to any disclaimer, the term of this patent is extended or adjusted under 35 U.S.C. 154(b) by 0 days.

(21) Appl. No.: 14/325,493

(22) Filed: Jul. 8, 2014

(65) Prior Publication Data

US 2014/0322840 A1 Oct. 30, 2014

Related U.S. Application Data

(62) Division of application No. 12/623,886, filed on Nov. 23, 2009, now Pat. No. 8,811,439.

(51) Int. Cl.
*H01L 21/00* (2006.01)
*H01S 3/04* (2006.01)
(Continued)

(52) U.S. Cl.
CPC ....... *H01S 5/02268* (2013.01); *H01S 5/02469* (2013.01); *H01L 2224/49175* (2013.01);
(Continued)

(58) Field of Classification Search
CPC .............. H01S 5/02268; H01S 5/02469; H01S 5/02272; H01S 5/02; H01S 5/005; H01S 5/02276; H01S 5/02212; H01S 5/02288; H01L 2224/49175; Y10T 29/49826
(Continued)

(56) References Cited

U.S. PATENT DOCUMENTS 4,573,255 A 3/1986 Gordon et al.
4,615,031 A 9/1986 Eales et al.
(Continued)

FOREIGN PATENT DOCUMENTS

CN 2910259 Y 6/2007
DE 10257112 A1 6/2004
(Continued)

OTHER PUBLICATIONS

International Preliminary Report on Patentability dated Jun. 7, 2012 from counterpart International Application No. PCT/US2010/057411, filed Nov. 19, 2010.
(Continued)

*Primary Examiner* — Yuanda Zhang
(74) *Attorney, Agent, or Firm* — HoustonHogle LLP

(57) ABSTRACT

A system for self-aligning assembly and packaging of semiconductor lasers allows reduction of time, cost and testing expenses for high power density systems. A laser package mounting system, such as a modified TO-can (transistor outline can), has modifications that increase heat transfer from the active laser to a heat exchanger or other heat sink. A prefabricated heat exchanger assembly mounts both a laser package and one or more lenses. Direct mounting of a fan assembly to the package further minimizes assembly steps. Components may be physically and optically aligned during assembly by clocking and other indexing means, so that the entire system is self-aligned and focused by the assembly process without requiring post-assembly adjustment. This system can lower costs and thereby enable the use of high powered semiconductor lasers in low cost, high volume production, such as consumer items.

22 Claims, 19 Drawing Sheets

(51) Int. Cl.
*H01S 5/022* (2006.01)
*H01S 5/024* (2006.01)
*H01S 5/00* (2006.01)
*H01S 5/02* (2006.01)

(52) U.S. Cl.
CPC ............... *H01S 5/005* (2013.01); *H01S 5/02* (2013.01); *H01S 5/02212* (2013.01); *H01S 5/02272* (2013.01); *H01S 5/02276* (2013.01); *H01S 5/02288* (2013.01); *Y10T 29/49826* (2015.01)

(58) Field of Classification Search
USPC .................................. 372/34, 36; 438/27, 28
See application file for complete search history.

(56) References Cited

U.S. PATENT DOCUMENTS

| | | |
|---|---|---|
| 4,616,899 A | 10/1986 | Schlafer |
| 4,625,317 A * | 11/1986 | Kolb ................ H01S 3/041 372/107 |
| 4,803,689 A | 2/1989 | Shibanuma |
| 4,834,490 A | 5/1989 | Falkenstein et al. |
| 4,887,271 A | 12/1989 | Taylor |
| 4,953,171 A | 8/1990 | Nakajima et al. |
| D314,176 S | 1/1991 | Weber et al. |
| 5,005,178 A | 4/1991 | Kluitmans et al. |
| 5,026,134 A | 6/1991 | Sugawara et al. |
| 5,029,968 A | 7/1991 | Geiser, Jr. et al. |
| 5,049,762 A | 9/1991 | Katoh |
| 5,065,226 A | 11/1991 | Kluitmans et al. |
| 5,073,047 A | 12/1991 | Suzuki et al. |
| 5,074,682 A | 12/1991 | Uno et al. |
| 5,100,507 A | 3/1992 | Cholewa et al. |
| 5,107,537 A | 4/1992 | Schriks et al. |
| 5,124,281 A | 6/1992 | Ackerman et al. |
| 5,127,074 A | 6/1992 | Watanabe et al. |
| 5,156,999 A | 10/1992 | Lee |
| 5,195,102 A | 3/1993 | McLean et al. |
| 5,195,155 A | 3/1993 | Shimaoka et al. |
| 5,197,076 A | 3/1993 | Davis et al. |
| 5,212,699 A | 5/1993 | Masuko et al. |
| 5,216,737 A | 6/1993 | Driessen et al. |
| 5,227,646 A | 7/1993 | Shigeno |
| 5,233,622 A | 8/1993 | Iwamoto |
| 5,255,167 A | 10/1993 | Toussaint et al. |
| 5,334,854 A | 8/1994 | Ono et al. |
| 5,399,858 A | 3/1995 | Kinoshita |
| 5,409,482 A | 4/1995 | Diamantopoulos |
| 5,440,574 A | 8/1995 | Sobottke et al. |
| 5,469,456 A | 11/1995 | Rogers et al. |
| 5,481,556 A * | 1/1996 | Daikuzono ................ 372/34 |
| 5,550,675 A | 8/1996 | Komatsu |
| 5,640,407 A | 6/1997 | Freyman et al. |
| 5,646,674 A | 7/1997 | Bacon et al. |
| 5,673,350 A | 9/1997 | Song et al. |
| 5,870,133 A | 2/1999 | Naiki |
| 5,960,142 A | 9/1999 | Shimizu |
| 6,026,109 A | 2/2000 | Micke et al. |
| 6,370,173 B1 * | 4/2002 | Martin ............................ 372/36 |
| 6,400,011 B1 | 6/2002 | Miki |
| 6,490,303 B1 | 12/2002 | Komiyama et al. |
| 6,724,958 B1 | 4/2004 | German et al. |
| 6,758,845 B1 | 7/2004 | Weckwerth et al. |
| 6,778,576 B1 | 8/2004 | Acklin et al. |
| 6,840,686 B2 | 1/2005 | Jiang et al. |
| 6,860,651 B2 | 3/2005 | DeRosa et al. |
| 6,861,641 B1 | 3/2005 | Adams |
| 6,868,104 B2 * | 3/2005 | Stewart et al. ................ 372/36 |
| 6,869,231 B2 | 3/2005 | Chiu et al. |
| 6,901,095 B2 | 5/2005 | Tsunetomo et al. |
| 6,901,221 B1 | 5/2005 | Jiang et al. |
| 6,931,215 B1 | 8/2005 | Fukuda et al. |
| 6,960,776 B2 | 11/2005 | Machi |
| 6,973,106 B1 | 12/2005 | Chaoui |
| 6,980,353 B2 | 12/2005 | Watson et al. |
| 7,044,661 B2 | 5/2006 | Kandar-Kallen et al. |
| 7,092,418 B2 | 8/2006 | Stewart et al. |
| 7,287,918 B2 | 10/2007 | Kataoka et al. |
| 7,330,491 B2 | 2/2008 | Stephens, IV et al. |
| 2005/0089070 A1 | 4/2005 | Honda |
| 2005/0130342 A1 | 6/2005 | Zheng et al. |
| 2005/0224705 A1 | 10/2005 | Tobiason et al. |
| 2006/0140555 A1 | 6/2006 | Kataoka et al. |
| 2006/0224081 A1 | 10/2006 | Meyer et al. |
| 2007/0070297 A1 | 3/2007 | Matic-Vujovic et al. |
| 2007/0100401 A1 | 5/2007 | Lin |
| 2007/0266714 A1 * | 11/2007 | Fiedler ................ 62/6 |
| 2008/0187019 A1 | 8/2008 | Chung |
| 2009/0087142 A1 * | 4/2009 | Shibayama ................ B41J 2/46 385/33 |

FOREIGN PATENT DOCUMENTS

| | | | |
|---|---|---|---|
| EP | 1 384 446 A1 | 1/2004 | |
| EP | 1689054 A1 * | 8/2006 | ............ H01S 5/022 |
| JP | 60009188 A | 1/1985 | |
| WO | 2008/153178 A1 | 12/2008 | |

OTHER PUBLICATIONS

International Search Report completed on Mar. 23, 2011, from corresponding application No. PCT/US2010/057411, filed on Nov. 19, 2010.

Partial International Search Report mailed on Apr. 7, 2011, from corresponding application No. PCT/US2010/057411, filed on Nov. 19, 2010.

* cited by examiner

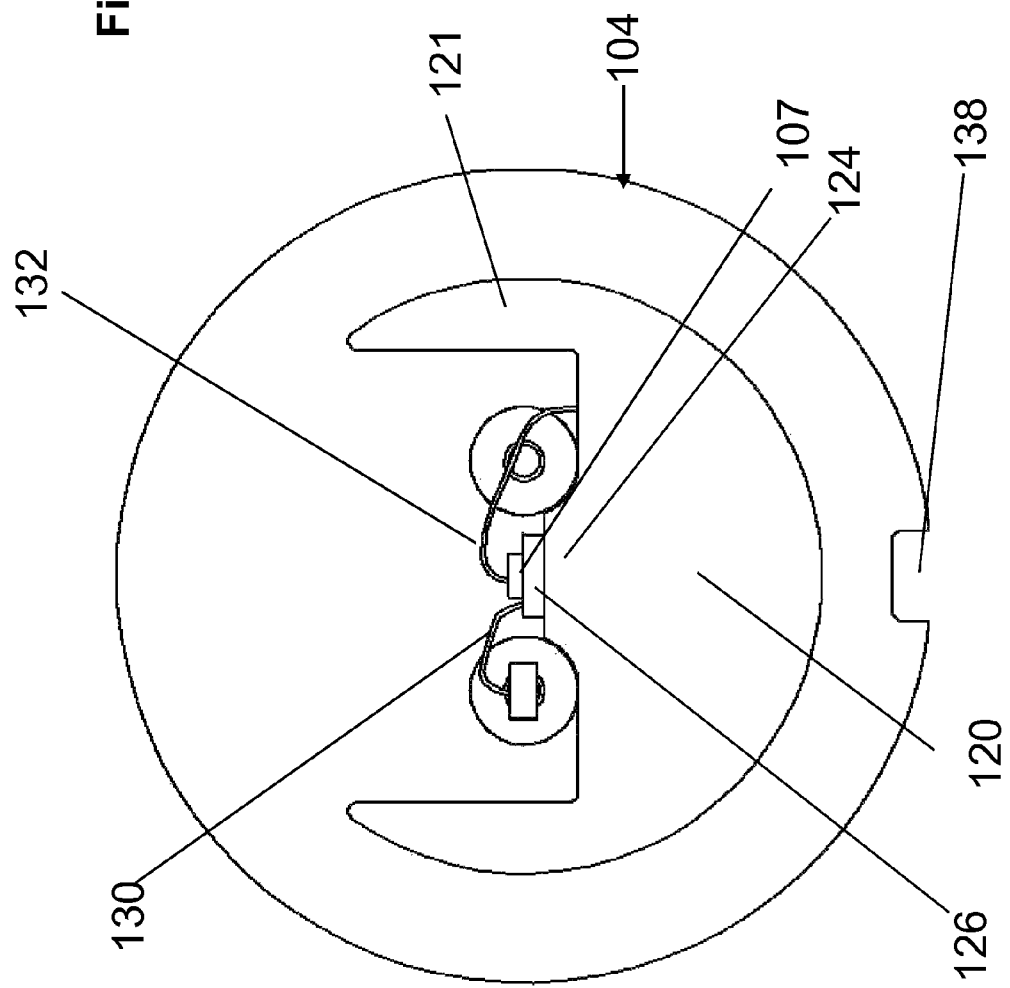

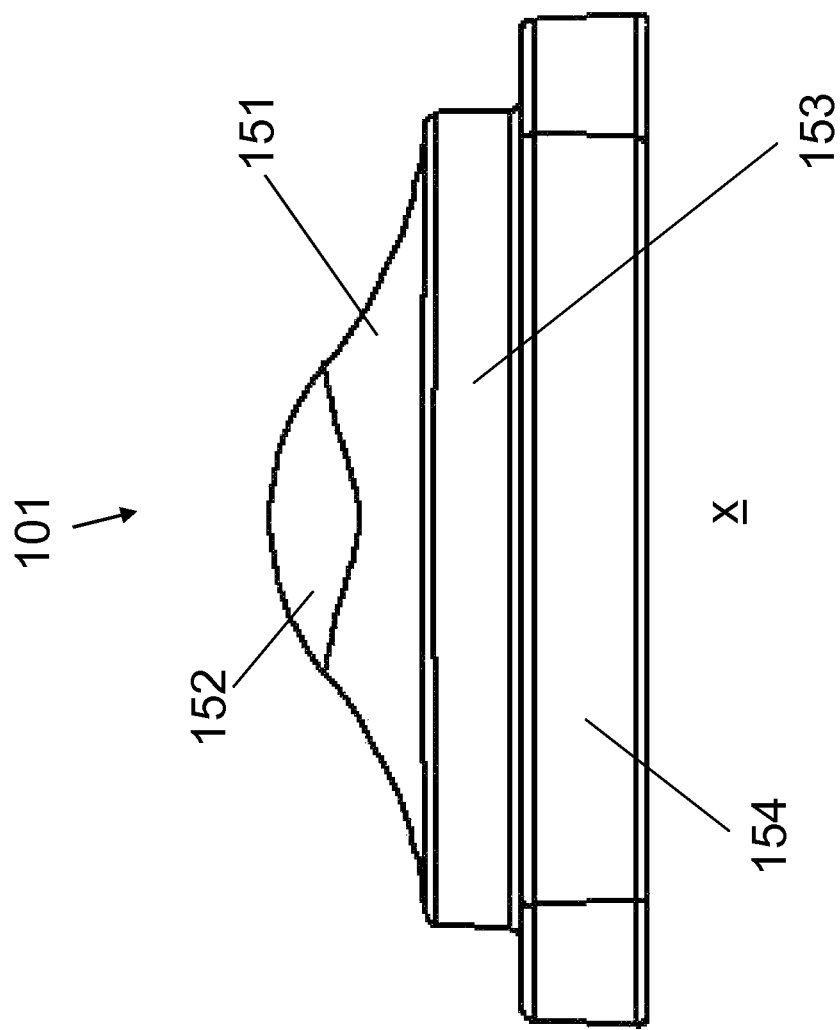

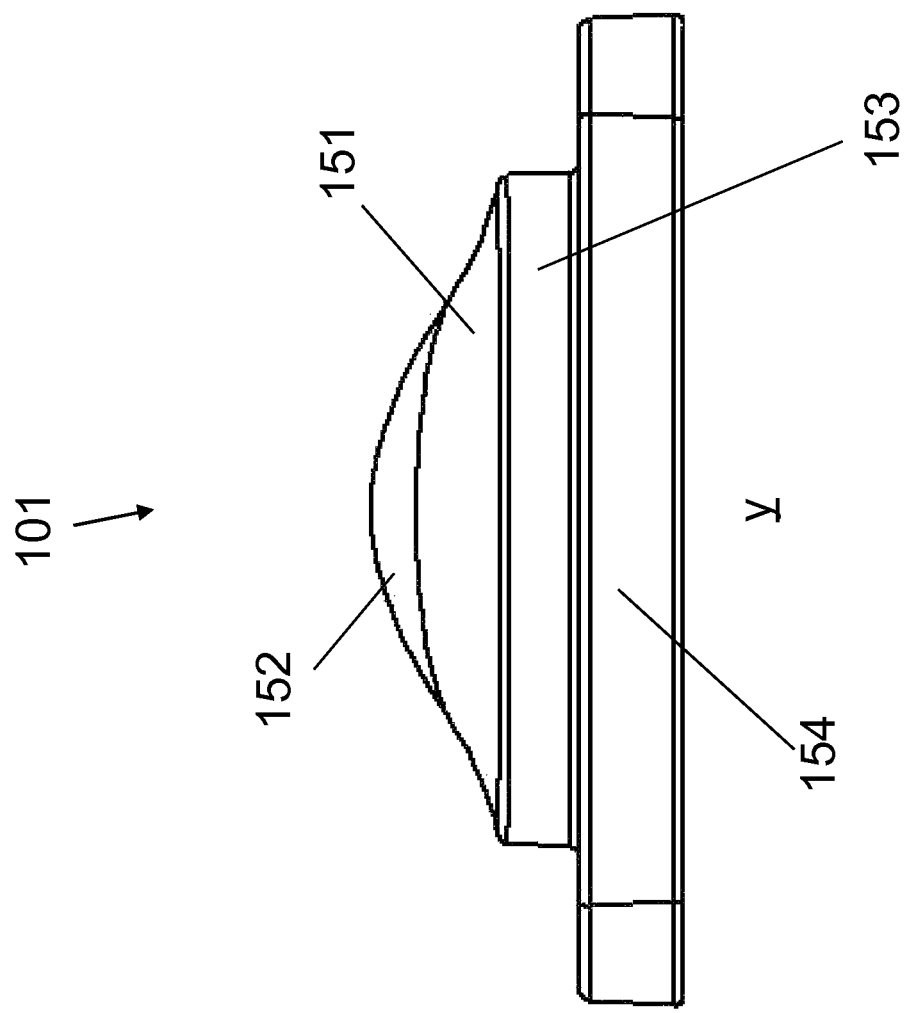

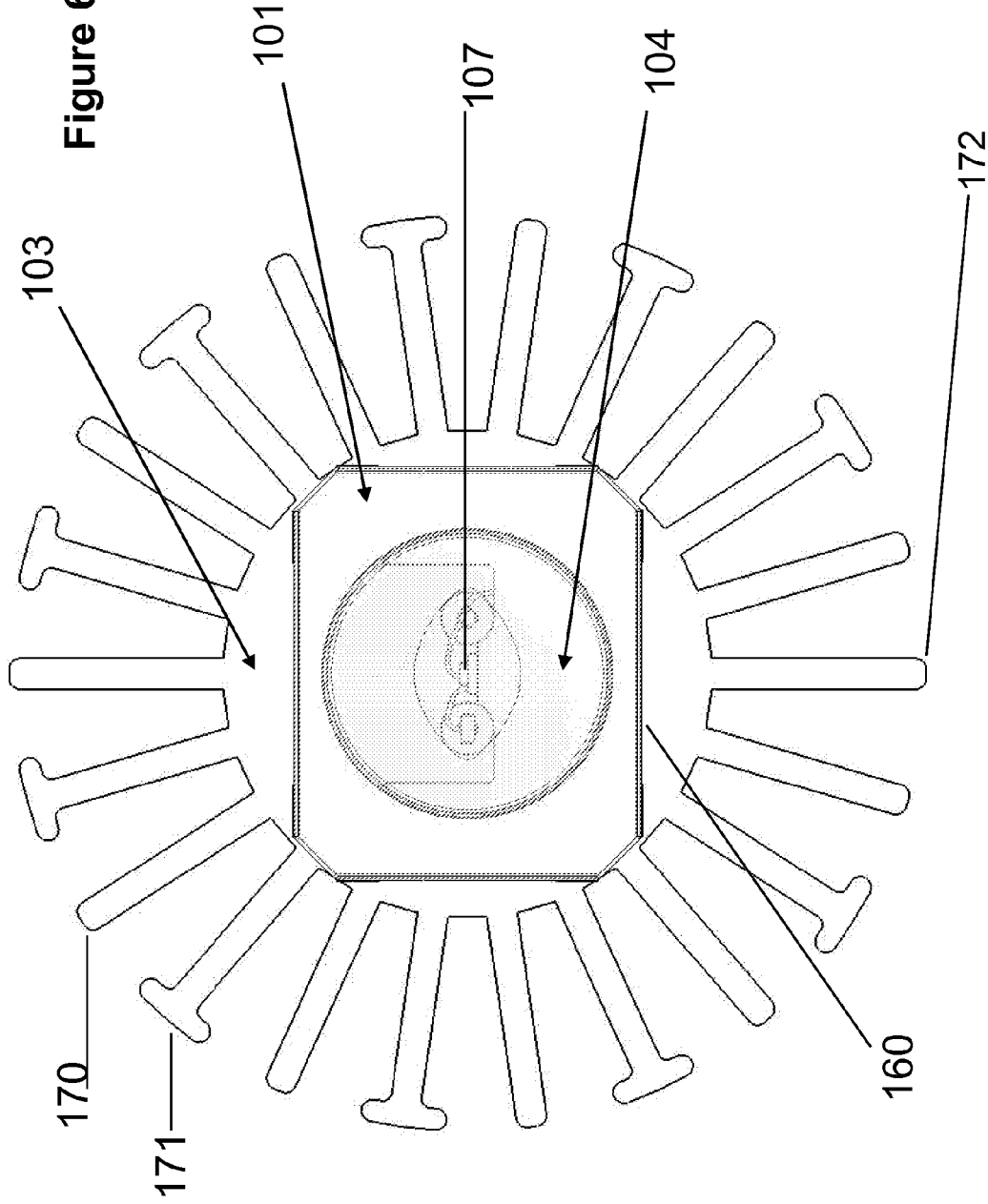

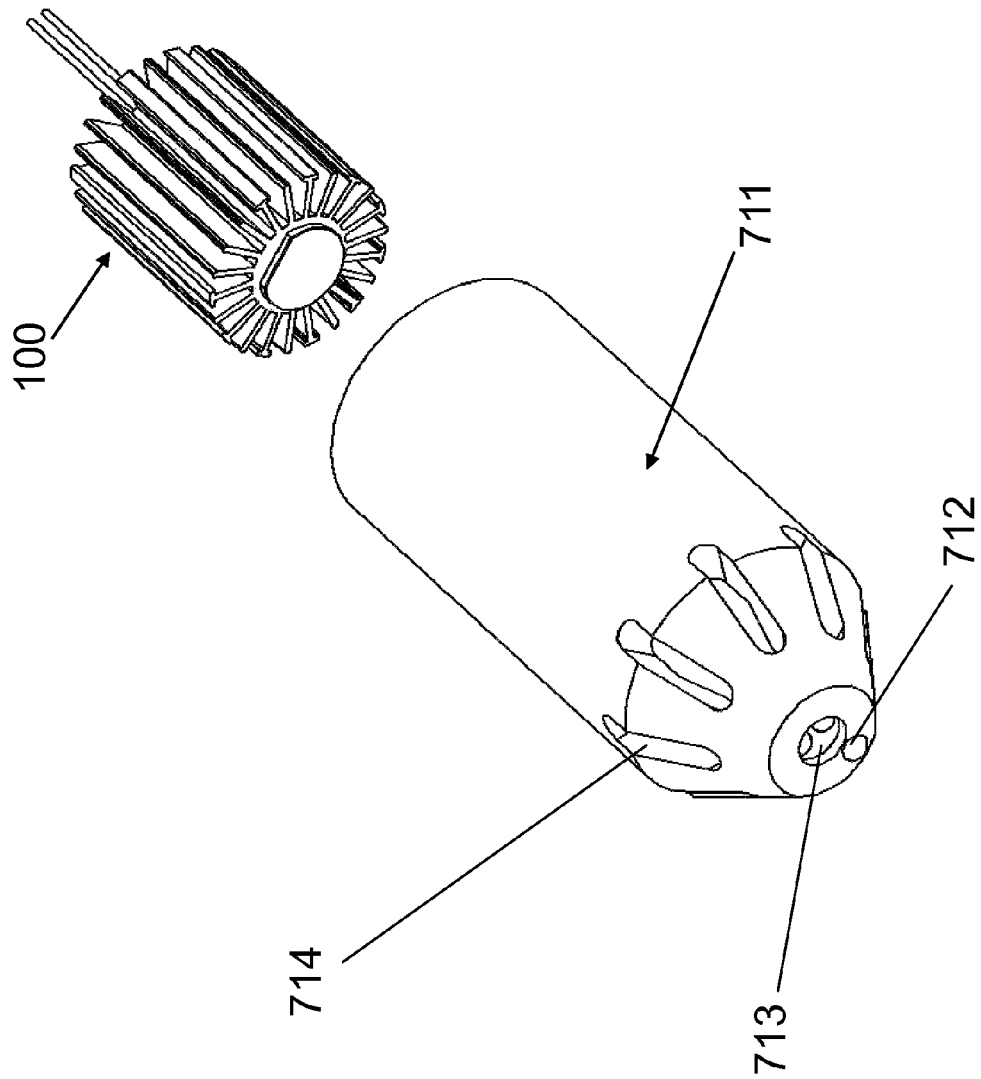

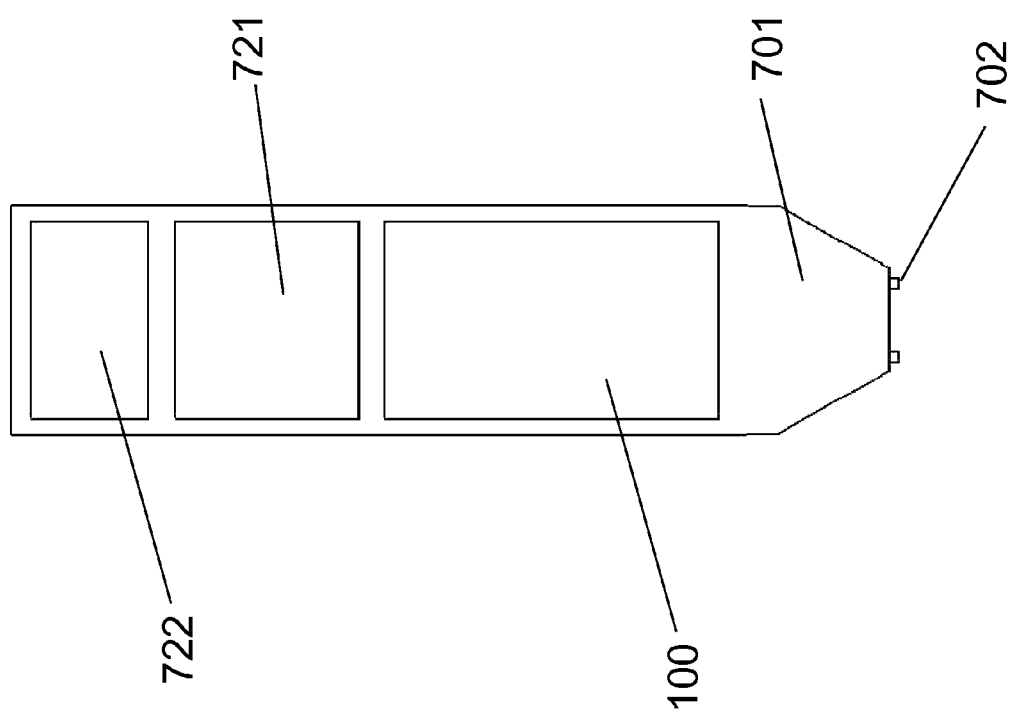

SEMICONDUCTOR LASER ASSEMBLY AND PACKAGING SYSTEM

RELATED APPLICATIONS

This application is a Divisional of U.S. application Ser. No. 12/623,886, filed on Nov. 23, 2009, now U.S. Patent Publication No. US 2011/0122905 A1, which is incorporated herein by reference in its entirety.

BACKGROUND OF THE INVENTION

Lasers have a wide variety of uses, and the number of uses expands as the benefits of lasers are tested in new markets. Such expanded uses often require significant innovation to meet the demands of new uses. Availability of new types of lasers is important in this process. Presently, many new wavelengths of inexpensive laser diodes are now available, and their properties have potential for broadening the use of lasers in industry, medicine and home uses, by opening up applications that require higher power lasers for high volume low cost applications.

To make such projects practical, it is necessary to solve key problems. In particular, higher power requires improvements in numerous areas, including heat dissipation, size, cost, and safety. It is especially important to be careful to minimize costs for laser systems intended for home use and other consumer or non-traditional laser markets. In such markets, there is a need for efficient manufacturing, to obtain costs suitable for mass marketing.

Cost minimization requires not only large volume production of components, but minimization of complexity and associated assembly labor. In particular, rework or manual adjustment of alignment should be avoided. Such problems have been solved for low power semiconductor optical devices, such as LEDs (light emitting diodes) used in reading optical discs and the like. In these systems the semiconductor LEDs need to have certain power levels, but precise optical alignment and focus are not required, because emission is close to the disc, and detection of signal does not require precise focusing. The absence of a requirement for focusing or re-focusing is typical of current large-volume laser chip applications.

However, emerging uses for low cost high power lasers, for example as described in our co-pending application PCT/US2009/001350, published as WO 2009/111010 A1, require precise optical alignment of a laser with an instrument, and in some cases a sharp focus. Yet in consumer uses, the cost of the laser components of a system must be minimized. The production cost of such systems comprises the production of the laser semiconductor chips; the mounting of the chips in a device; and the alignment and testing of the device.

SUMMARY OF THE INVENTION

Testing and alignment still require human participation for each device. Removal or minimization of human labor is a critical component for allowing the use of high power lasers in mass-market or other high volume devices, which can include portable medical equipment and other applications requiring high laser power, especially in those uses also requiring focus and/or alignment of the laser beam.

A potentially inexpensive laser system is described in which potentially multi-Watt laser capabilities are provided in a package suitable for mass production and consumer use. A wide variety of wavelengths can be provided by the system, including in particular wavelengths of 500-2000 nanometers (nm). For consumer use, eye-safe wavelengths emitted in regions of high water absorption are preferred.

Aspects of the present invention concern a laser system that is capable of making high powered laser techniques available for high volume market uses, for example in medical clinics, field medical applications, forensics/law enforcement, and/or consumer use. A key innovation is the combination of a variety of techniques to produce a laser system that can be assembled from simple parts in a few motions or manufacturing steps, and which can emerge from assembly in a state of optical alignment and "plug and play" operation, whether powered from a wall socket or a battery pack.

The system is characterized in being largely self assembling from suitably configured parts. In a first aspect, the system is made self-assembling by the provision of parts that can be assembled simply by physical contact of the parts. For example, a chip carrier and a heat sink are configured so that the carrier, with the chip bonded to it, can be inserted into the heat sink and held in place by closeness of fit, optionally augmented by adhesive or solder. In a second aspect, the system is self-clocking rotationally. In a third aspect, the components are self-aligned at least in part by their radial centering within a cavity in at least one component.

In other aspects, the system further comprises at least one optical element. The optical element is preferably mounted via the cavity in the system. A fan may be included in the system to improve heat removal. Each component which is not functionally rotationally symmetric is preferably clocked during the assembly process so as to be joined in a predetermined rotational position with respect to the rest of the system.

In general, according to one aspect, the invention features a laser system, comprising: a heat exchanger having a bore extending through the heat exchanger; a carrier on which a semiconductor gain chip is mounted, at least part of the carrier being mounted in the bore; and lens mounted on the heat exchange and over the bore.

In embodiment, a fan for flowing air over the heat exchanger is provided. In another example, the fan flows air on or about the area that the laser light is project onto.

In general, according to another aspect, the invention features a method for assembling high powered semiconductor laser systems to provide lasers which are passively or self-aligned and have predefined focal points or imaging planes without post-fabrication adjustment, wherein the method comprises: affixing a semiconductor laser chip to a carrier, said carrier having power connections and heat spreading means; placing said carrier into a heat-exchanging relationship with a heat exchanger, whereby said heat exchanger and said carrier are passively or self aligning into an efficient heat exchanging contact; and affixing an optical element to one or both of said heat exchanger for said diode laser, and said carrier; wherein laser systems produced by said method each have at least one output laser beam from each semiconductor laser chip, each beam having a predefined direction of propagation without post-fabrication adjustment.

In embodiments, the chip is connected to the carrier via a heat-spreading mount attached to a body of said carrier, mount has a body which sets the depth of engagement with the heat exchanger. The heat exchanger has a central bore, and the outer surface of the bore-entering portion of said mount and the inner surface of said bore are constructed to create close proximity between their surfaces, upon assembly, to allow efficient heat transfer between said laser diode and said heat exchanger. Preferably, the components are mutually self-aligned at least in part by their radial centering within a cavity in at least one component. In some cases each component which is not functionally rotationally symmetric is self-aligning during the assembly process so as to be joined in a predetermined rotational position with respect to the rest of the system.

For assembly, a basis for clocking is providing at least one of said fins to be distinguishable from other fins in shape or location. The laser facet is centered in the system when the assembly is completed by affixing said laser to a location on said carrier in a location that will be centered after the mutual alignment of said carrier and said heat exchanger.

In general according to another aspect, a method for assembling semiconductor laser systems to provide lasers which are self-aligned and have predefined focal distances or imaging planes, without post-fabrication adjustment, wherein the method comprises: affixing a semiconductor laser chip to a carrier; and placing said carrier into a heat-exchanging relationship with a heat exchanger, wherein said heat exchanger and said carrier are self aligning into a heat exchanging contact.

In general according to another aspect, a method for assembling optical systems which are self-aligned and have predefined focal distances or imaging planes, without post-fabrication adjustment, wherein the method comprises affixing an optical element to a heat exchanger for a diode laser; and placing said optical element into a heat-exchanging relationship with a heat exchanger, wherein said heat exchanger and said optical element are self aligning into a heat exchanging contact.

In general according to another aspect, the invention features a laser diode mounting system, the system comprising: a semiconductor laser; at least one heat spreading member; a heat exchanger; and at least one optical component, said optical component affixed to one or more of said carrier and said heat exchanger; wherein the lasers produced by said method each have an output laser beam from said semiconductor laser chip, each beam having a predefined direction of propagation without adjustment.

In general according to another aspect, the invention features a housing system, which acts as an enclosure for a laser system, with at least one contact located at the interface where the light is emitted, which when enabled, permits operation of the laser assembly.

In examples, a contact of is enabled by a rolling motion a pressure sensor. In some examples, the optical emission is proportionally controlled by feedback from the contact.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same or similar parts throughout the different views. The drawings are to scale. Of the drawings:

FIG. 4 is a face-on front view of the mounted laser chip.

FIG. 5b is face-on view of a lens in the "x" direction suitable for the laser system.

FIG. 5c is face-on view of a lens in the "y" direction suitable for the laser system.

FIG. 6 is a face-on view of the lens mounted to the laser system of FIG. 1.

FIG. 16 shows a perspective view of an alternate housing system from FIG. 15 for enclosing an assembled laser engine with an embedded a sensor system.

FIG. 17 shows a block diagram of a housing system for enclosing an assembled laser engine with an embedded a sensor system.

DETAILED DESCRIPTION OF THE PREFERRED EMBODIMENTS

Terms used herein generally have their conventional meanings. "Optical element" is used as a term known in the art, comprising components such as a lens, a prism, a mirror, a light pipe, a diffuser, or a similar element which changes the light pattern or acts on the optical profile of the laser output. "Clocking" or "clocked" denotes the provision or creation of proper rotational alignment between given members of an assembly. A laser power supply may be any power source, including a battery or a plug-in electrical supply of energy. "Passively-aligned" or "self-aligned" denotes the alignment of parts in an assembly in which the elements are aligned by mechanical or optical alignment elements, so that the laser diode does not necessarily need to be powered on to see where the light is focused or transmitted. A "heat spreader" is a form of heat sink comprising any device or portion thereof suitable for lowering the temperature of a locus in a device by conducting heat from a first region into a second region of greater area than the first.

In its basic structure, the improved packaging system for self-aligning assembly and packaging of semiconductor lasers, or more generally semiconductor gain chips, comprises at least a semiconductor gain chip (such as a laser chip), bonded to a suitable carrier and connected to a power supply, and a heat exchanger in contact with the carrier. Preferably, the components of the system are mutually self aligning upon assembly, or are readily aligned, by machine or manually, by the use of clocking and other orientation mechanisms. In particular, both a self-aligning laser system and a method of making it are provided.

Figure 1:
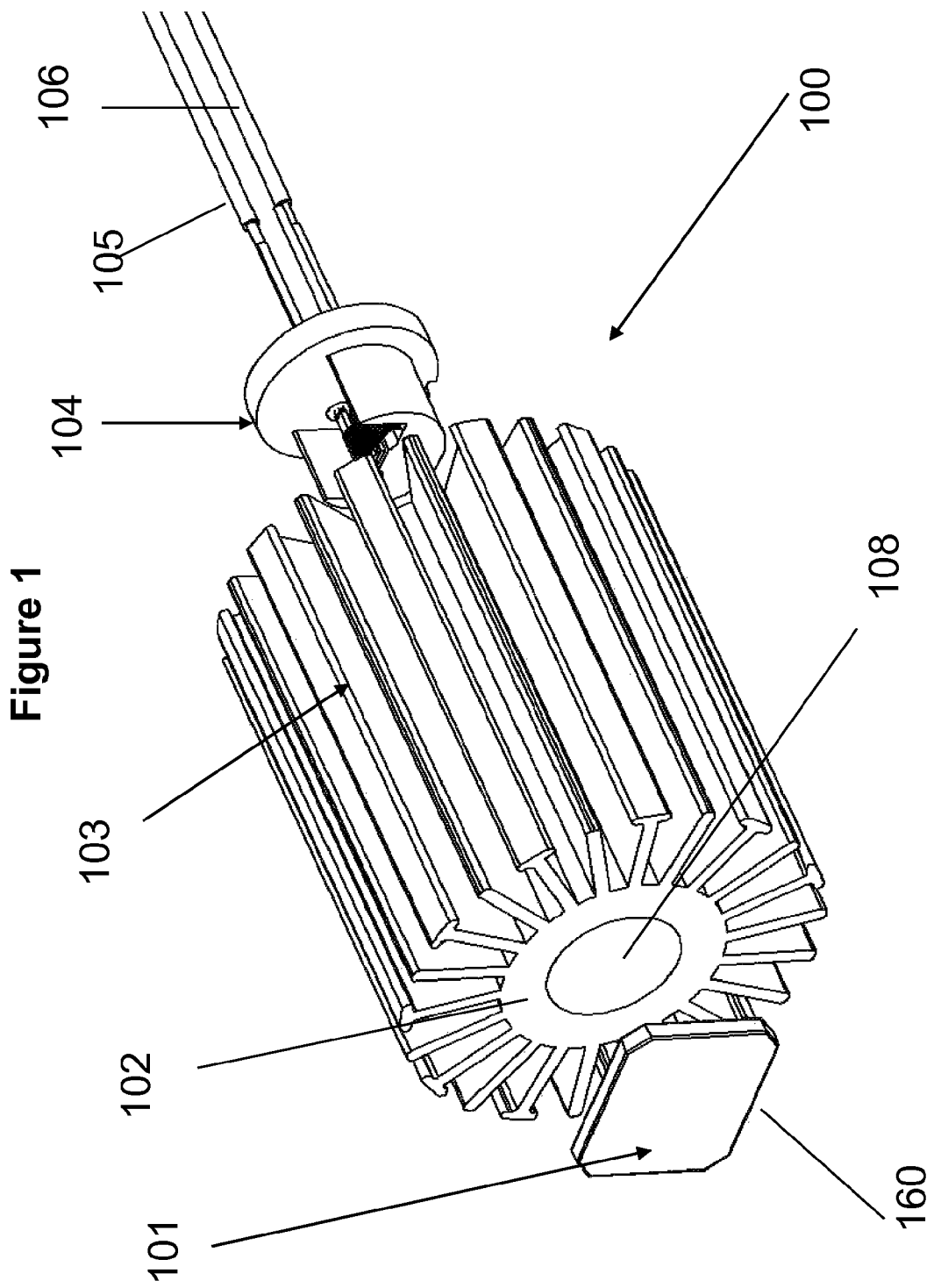
FIG. 1 is a partially-exploded perspective view of a laser system that embodies aspects of the invention.

FIG. 1 is a partially exploded overall view of a first embodiment of an assembled laser system. In FIG. 1, the system 100 has an application focusing lens 101; a heat dissipating device 103, called a heat exchanger or a radiator herein, having a front face 102; a TO-can-type laser carrier 104 having refinements, described below; and one or more (typically two or three) power leads 105, 106, for the laser and optionally for other sub-systems. In a finished device of this embodiment, air or other fluid is circulated past the fins of the heat exchanger 103. A central bore 108 in the heat exchanger 103 provides a mounting place for other parts of the system, and contributes to their orientation. The lower edge 160 of the lens 101 is preferably used for rotational clocking during assembly.

Figure 2:
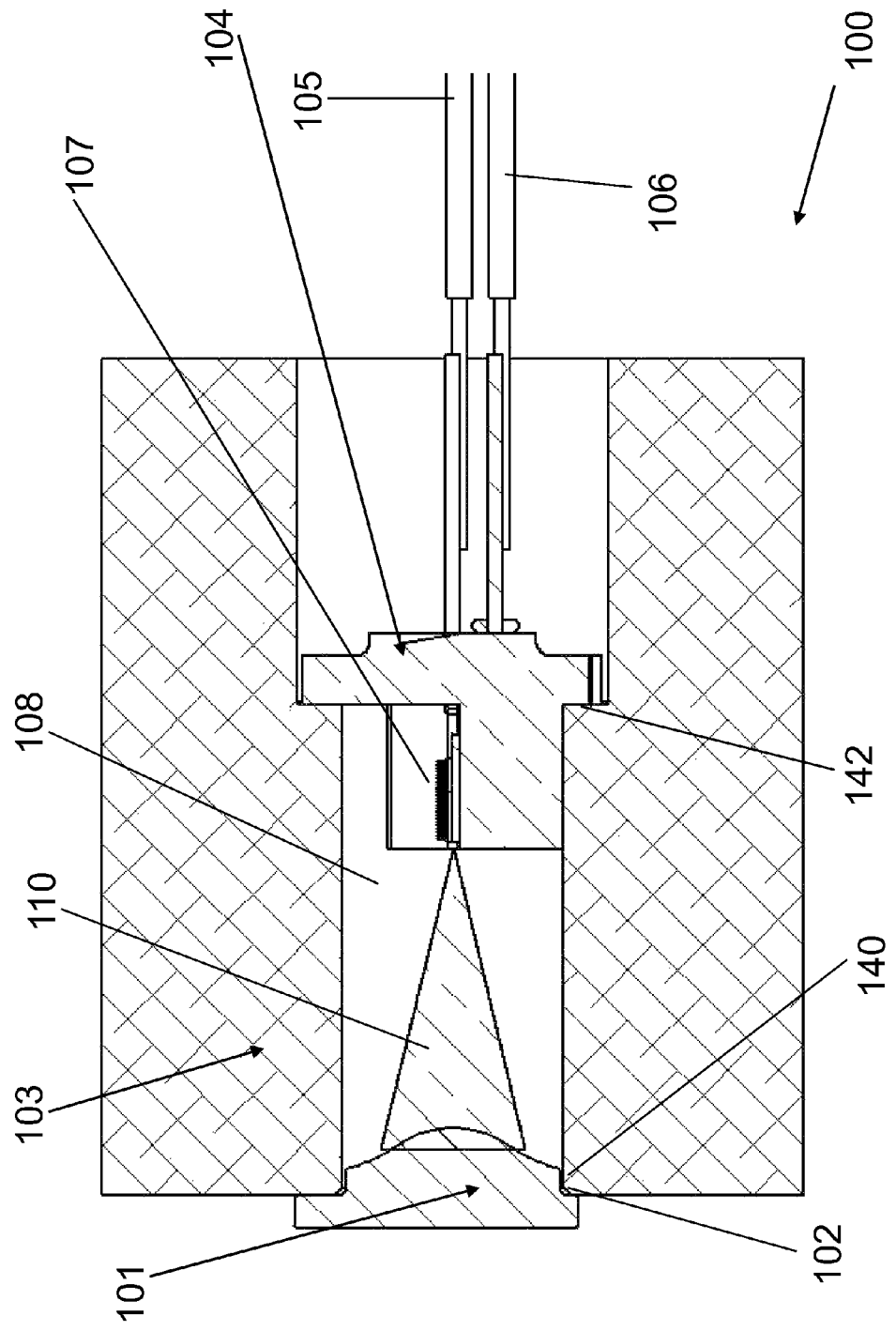
FIG. 2 is a cross section of the laser system of FIG. 1.

FIG. 2 shows a cross-section of the system 100 of FIG. 1. The lens 101 is optionally held and mounted to the heat exchanger 103 with epoxy or solder that is applied to proximal face 102 of the heat exchanger 103 and/or within heat exchanger bore 108, thereby aligning the lens 101 with the central bore 108 of the heat exchanger 103. The semiconductor gain chip, such as a laser chip, 107 is mounted on the TO can assembly 104, as shown in detail below, and is connected to power leads 105, 106. The distance between the laser 107 and the focusing lens 101 is controlled by two detents 140, 142 in the central channel 108 of the heat exchanger 103. In this embodiment, the corner of the channel at the front face 102 serves as a detent. A cross section of the trajectory of the light emitted from laser chip 107 is shown as 110 within the central channel 108 of the heat exchanger.

The space between the lens 101 and the TO can 104 is laterally delimited by the walls of the bore 108 is typically filled with air. In certain applications, the space is filled with a majority of an inert gas such as Nitrogen, Argon or mixture of gases. In other examples, the space is evacuated creating a vacuum. In instances where the space is filled with a controlled atmosphere such as a majority of an inert gas or contains a vacuum, a hermetic seal is created at the interface between lens 101 and the heat exchanger 103 and between the TO can assembly 104 and the heat exchanger 103.

The TO can, 104, is secured to the heat exchanger using an affixing medium such as epoxy or solder. The extent of the area to which the medium affixes the TO-can vary from enveloping the entire surface of the TO-can to only one point on the TO-can surface.

Figure 3:
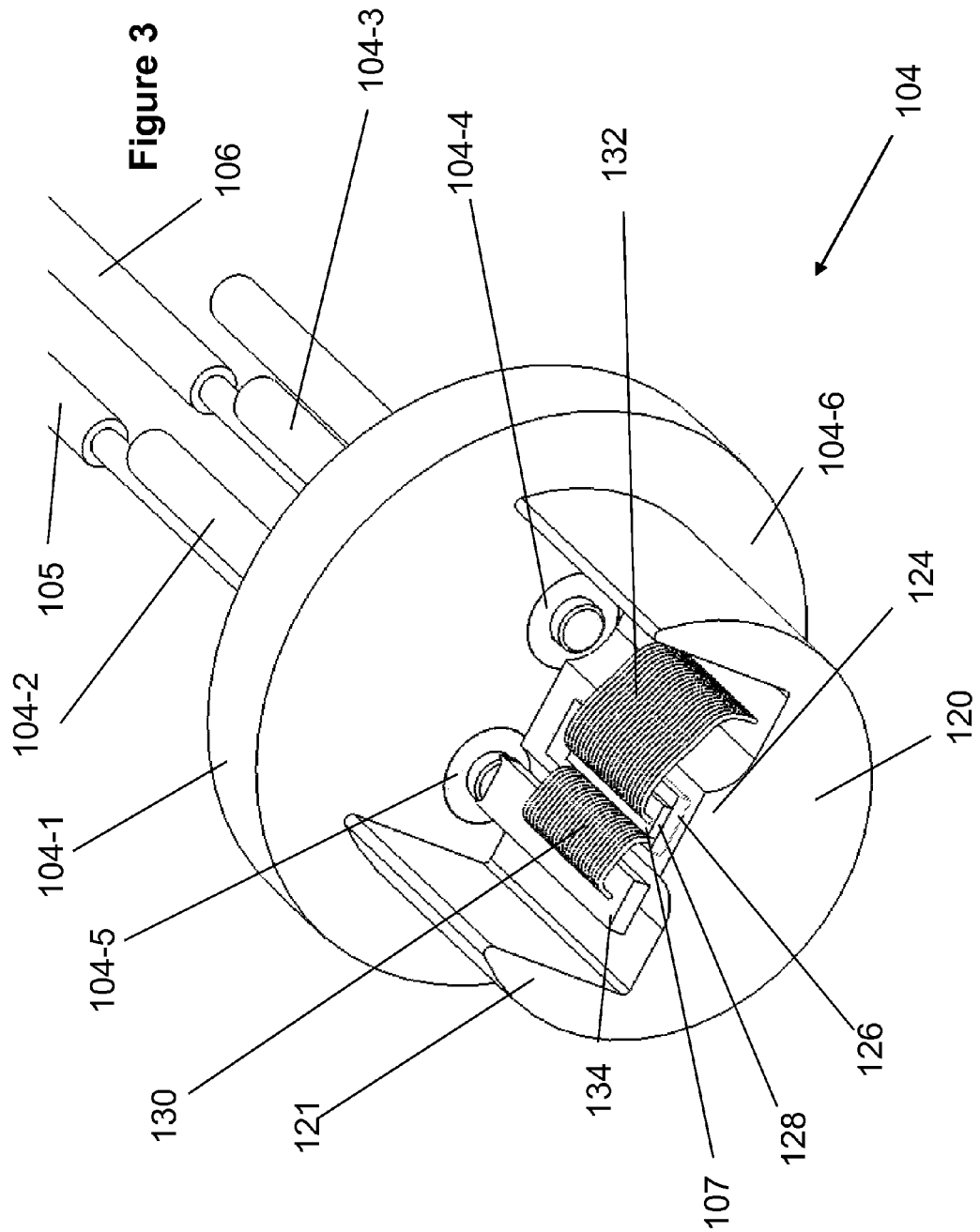
FIG. 3 is a perspective view of the laser chip and its mounting.

FIG. 3 shows the laser carrier 104 in more detail. The TO-style carrier 104 includes a cylindrical base 104-1 and a heat exchanger and mounting assembly ("mount") 120 that projects from face 104-6 on the base 104-1. The mount 120 has extensions 121, a pedestal area 124 and an optional submount 126, which may be of non-electrically conducting material or electrically-conducting material. The laser 107, with a front facet 128 for light emission, is bonded to the submount 126, for example by solder, and is electrically connected by wire bonds 130, 132 to leads 104-2 and 104-3. The leads 104-2 and 104-3 extend through the base 104-1 which contains an electrically insulating material, (such as glass) 104-4 and 104-5 and are connected to the power electrodes or wires 105, 106 that extend through the base 104-1 of the carrier. The wires 105, 106 terminate on wire bonds 130, 132. The anode wire bonds 130 are typically connected via a lead 134 which may be either circular, oval or flat in cross-sectional shape, and the cathode wire bonds 132 are typically connected directly to the mount 120. The wire bonding may be reversed as an engineering choice to give one power lead the anode connection and the other the cathode.

The laser 107 is a semiconductor laser diode (or "chip"). Such lasers are described in the art, for example in our co-pending applications US 2007/0002915 A1 and PCT/US2009/001350, published as WO 2009/111010 A1, (which are incorporated herein in their entireties by reference wherever such incorporation is permitted.) However, other types of laser chips may be used, including gallium arsenide laser chips. Laser chips at any available wavelength and material system may also be used in this assembly. In the laser shown in FIG. 3, wires from each of the wire bonds 130, 132 apply a current across a semiconductor laser chip 107 (from top to bottom as shown in FIGS. 2 and 3), and light is emitted perpendicular to the direction of current differential through the laser facet 128. (The other surfaces will normally be coated so as to reflect the wavelengths being generated.) As can be seen schematically in the cross-section of FIG. 2, the emitting facet 128 is preferably centered on the lens 101.

FIG. 4 shows the assembly of FIG. 3 in face view, so that the relationships among the laser 107, its optional support 126 and the wire bonds 130, 132 are clear. Also shown is the mechanical alignment interface that rotationally self aligns the carrier 104 with the heat exchanger 103. In more detail, a notch 138 in the carrier 104 is shown. The mechanical notch 138 is used to rotationally orient carrier 104 with the heat exchanger by mating with a mechanical spline on the heat exchanger. In other examples, intermediate tooling (not illustrated) is used to fix the rotational orientation of the carrier 104 with respect to the heat exchanger 103 when the carrier 104 is inserted into the central bore 108 of the heat exchanger. The optional mechanical notch 138 or an optical fiducial may be useful to align the parts in mechanical fixturing during assembly, so that the parts are clocked, i.e. oriented correctly, while epoxy or solder bonds the parts together permanently.

The mount 120 of the carrier 104 of FIG. 4 has features for facilitating heat transfer from the laser chip 107 to the heat exchanger 103. First, the mount 120 has peripheral extensions 121, with the outer surface of the extensions shaped, like the rest of the mount 120, to provide increased surface contact and thus heat conductive contact with the bore of a heat exchanger, such as heat exchanger 103 of previous figures. The total circumferential coverage of the mount 120 plus the extensions 121 is preferably at least 200 degrees of circumference, or more, such as 240 degrees or more. Thermal contact is further improved by heat-conducting adhesives or solders if required.

Second, the mount 120 has a central extension or pedestal 124 in the middle of the mount, to position the laser 107, for example at the center of rotation of the device, and also to act as a heat spreader to improve heat extraction from the laser 107 or the optional submount 126 into the mount 120. The curved sides of the pedestal 124 are designed to improve such heat transfer. While not physically pictured, in other embodiments, a lens or other optical element, such as a volumetric Bragg grating or diffractive optic is affixed to the peripheral extensions or mount.

Figure 5A:
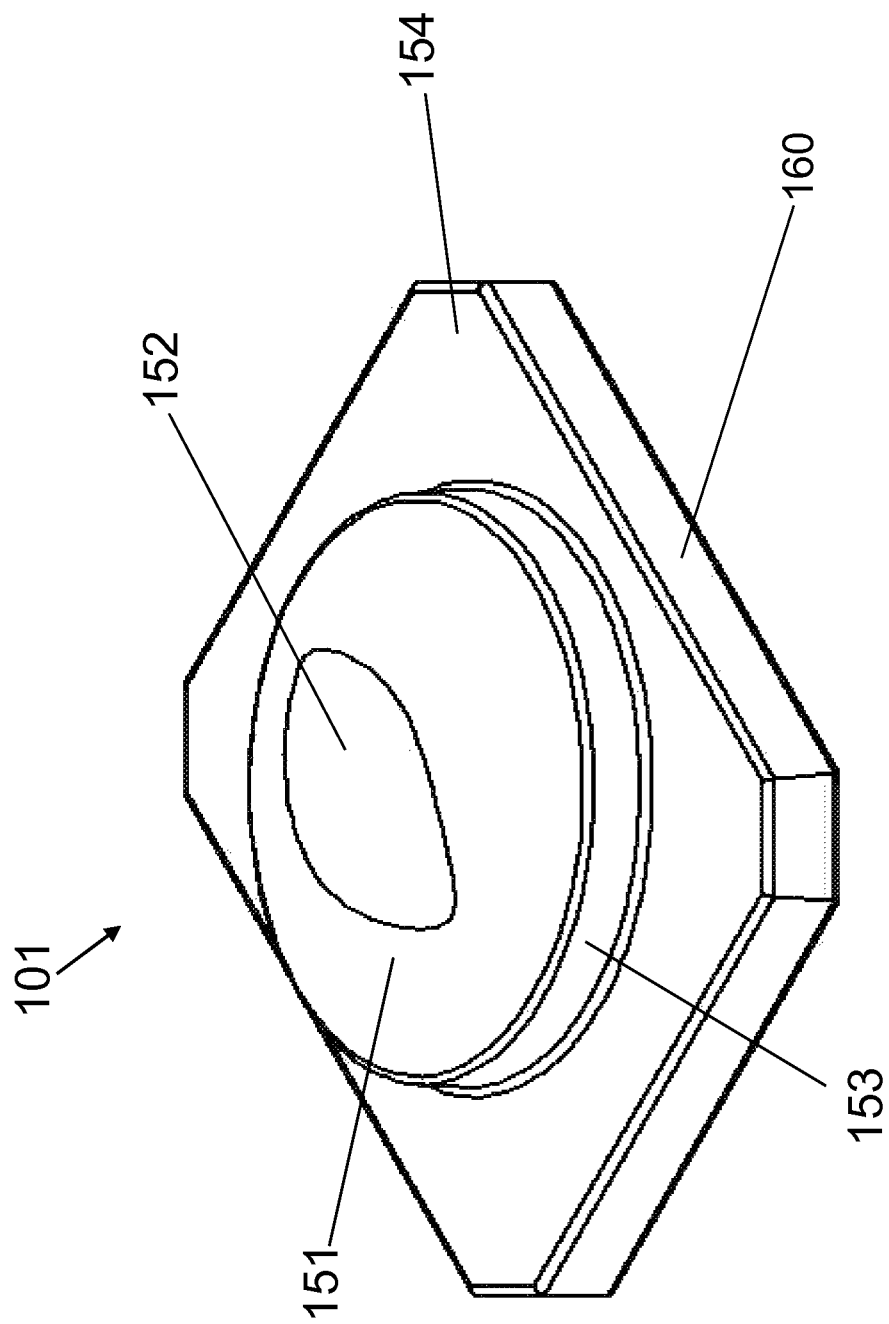
FIG. 5a is perspective view of a lens suitable for the laser system.

FIG. 5a, 5b, 5c shows a more detailed view of the lens 101. The lens in such systems will typically be aspheric, and in particular differing in profile in the "x" vs. "y" directions, because the light emitted from the laser facet 128 (front face) has differing dispersion in the direction across its width ("y" in this figure), vs. its height ("x" in this figure). The lens is designed to create either a collimated beam or a focused spot. The lens radius of curvature is different in the x and y dimensions of the lens. This is done, in the present embodiment, by providing a volume of material of a suitable refractive index and casting the material to have a complex surface profile, as illustrated in FIG. 5a, 5b, 5c. The curved surface 151 of the lens may have a different radius of curvature across the x-axis face as compared to the y-axis face, so that a locus of constant curvature 152 is not a circle, unlike a circularly symmetric lens. The lens 101 will typically comprise a pedestal 153, transmissive to the light emitted, and also preferably a transmissive plate 154 for use in binding the complete lens 101 to the heat exchanger face 102 (see in FIG. 1) or other location. The bulk materials for portions of the lens 151, 153 and 154 may be the same or different. Casting the entire lens assembly in a single operation from a single material is preferred for efficiency. An edge face 160 of the plate 154, optionally rectangular, is preferably used for alignment of the lens 101 with respect to the face 102 of the heat exchanger 103, as illustrated in FIG. 1, and thence with the laser facet 128. There is preferably an anti-reflective material coating on the optical surfaces of the lens (not labeled). Coatings for other purposes, including scratch prevention, are also possible.

FIG. 6 shows the lens 101 with a selected edge 160 aligned with the heat exchanger 103. In this embodiment, the radially extending fins of the heat exchanger 103 have exterior ends that are alternately straight ends 170 and T-shaped ends 171, to maximize heat exchanging area. However, fin 172, as shown here, would have a T-shaped end by this system, but in this embodiment does not. Using this anomaly as a reference then allows a reliable orientation of the heat exchanger 103 with respect to other components, including the carrier 104, the laser 107 and the lens edge 160, and provides routes so that this is achieved automatically during assembly.

Figure 7:
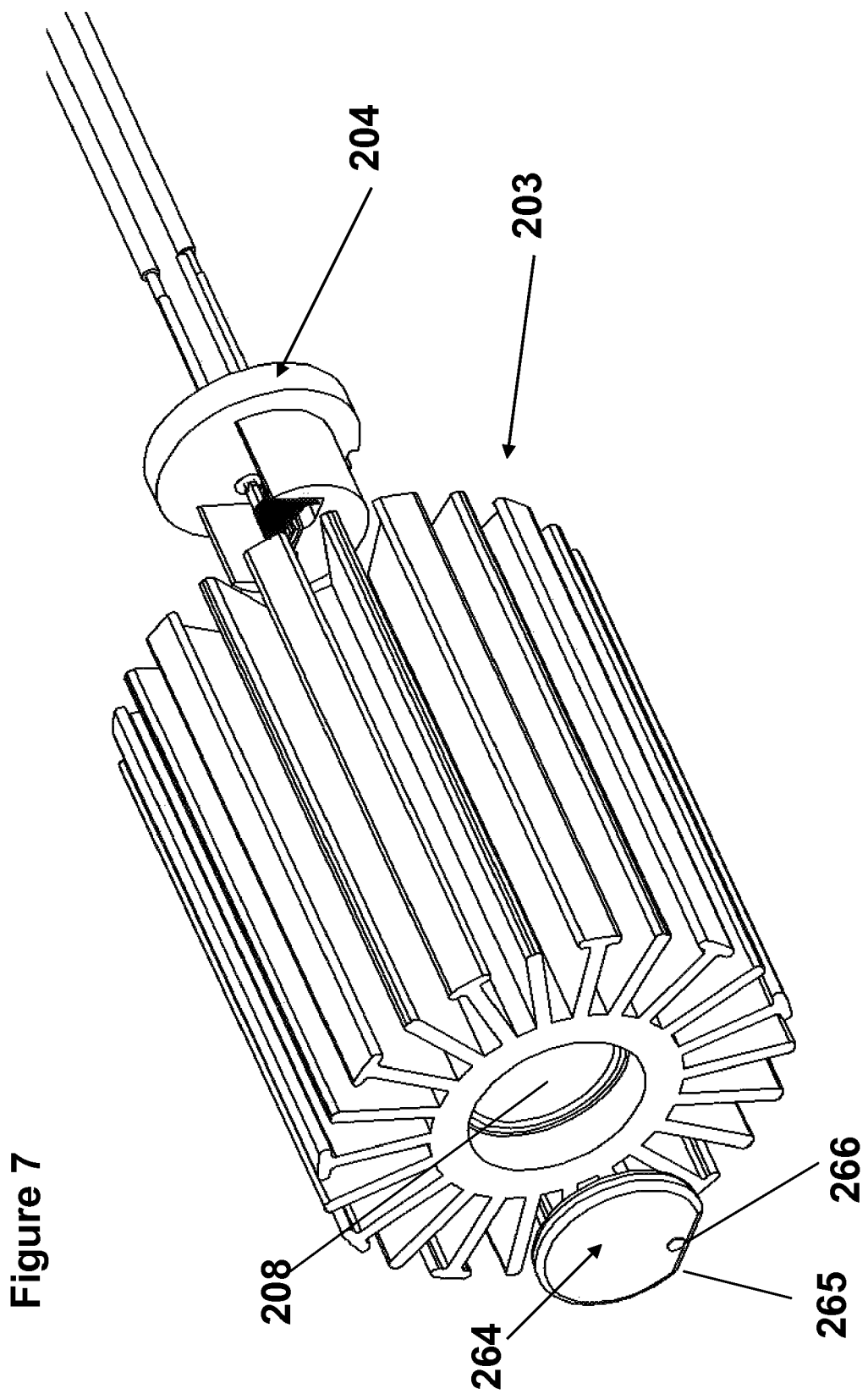
FIGS. 7 and 8 show a device that embodies aspects of the invention with an alternative lens mounting system.
Figure 8:
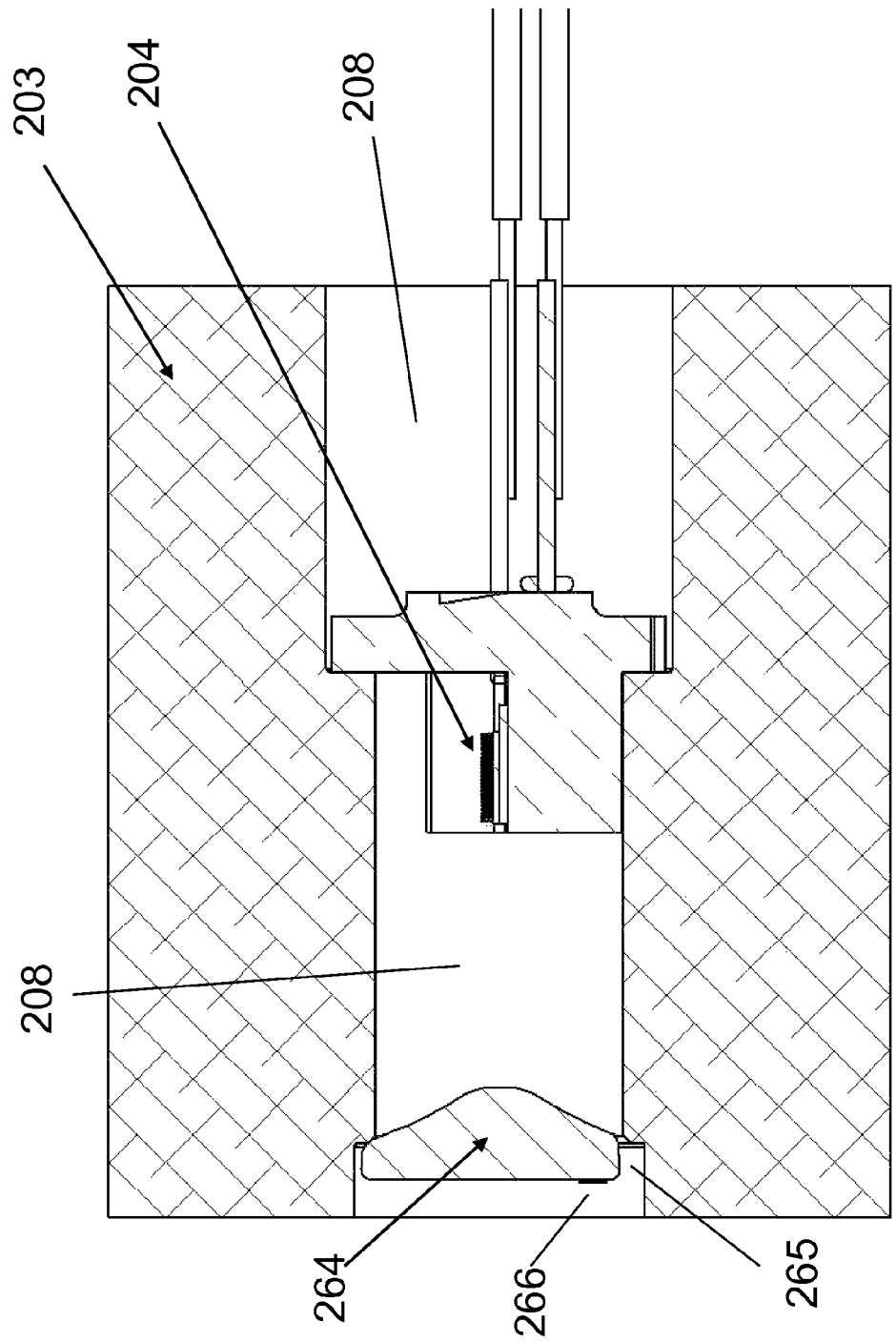

FIG. 7 shows an alternative mounting arrangement in perspective view, and FIG. 8 shows a cross section through the center of the same embodiment. A TO-can type assembly 204, similar to carrier 104 of FIG. 3, is mounted in a cavity 208 in a heat exchanger 203. The heat exchanger serves as a heat sink, and carries, in addition to the assembly 204, an aspheric lens 264, which is similar to the lens 101 in FIG. 4, in one implementation. As best seen in FIG. 8, the lens 264 is cut so as to be insertable into the cavity 208. The lens is made in various ways to enable reliable orientation, including for example a flat edge 265 and/or an orientation dot 266. Each of these components is held in place by epoxy or solder and aligned by mechanical flats or detents or by optical or mechanical alignment of fiducials, as in FIG. 1.

Figure 9:
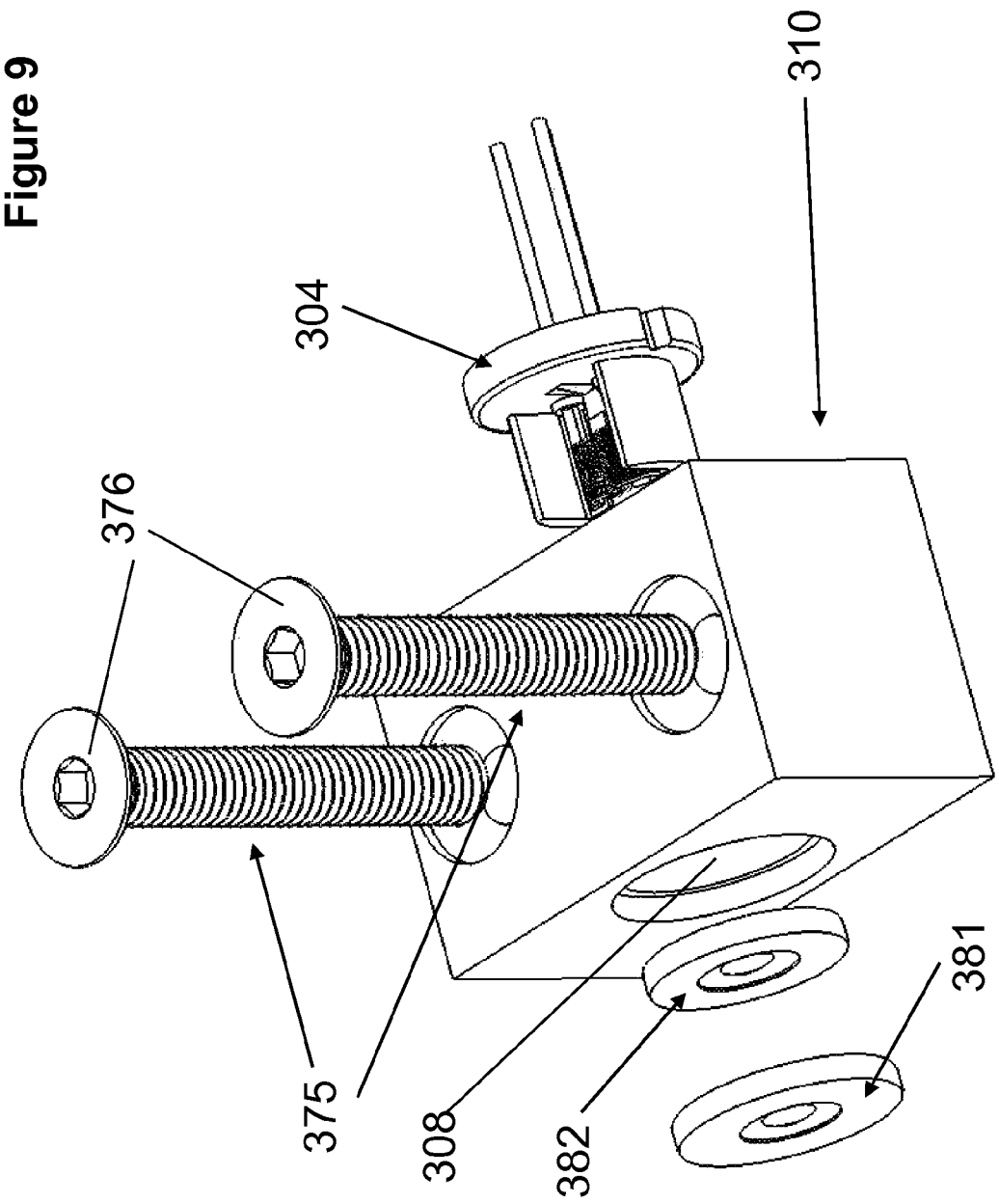
FIGS. 9 and 10 show a device that embodies aspects of the invention having a simple mounting system when a finned or other high-area heat exchanger is not required.
Figure 10:
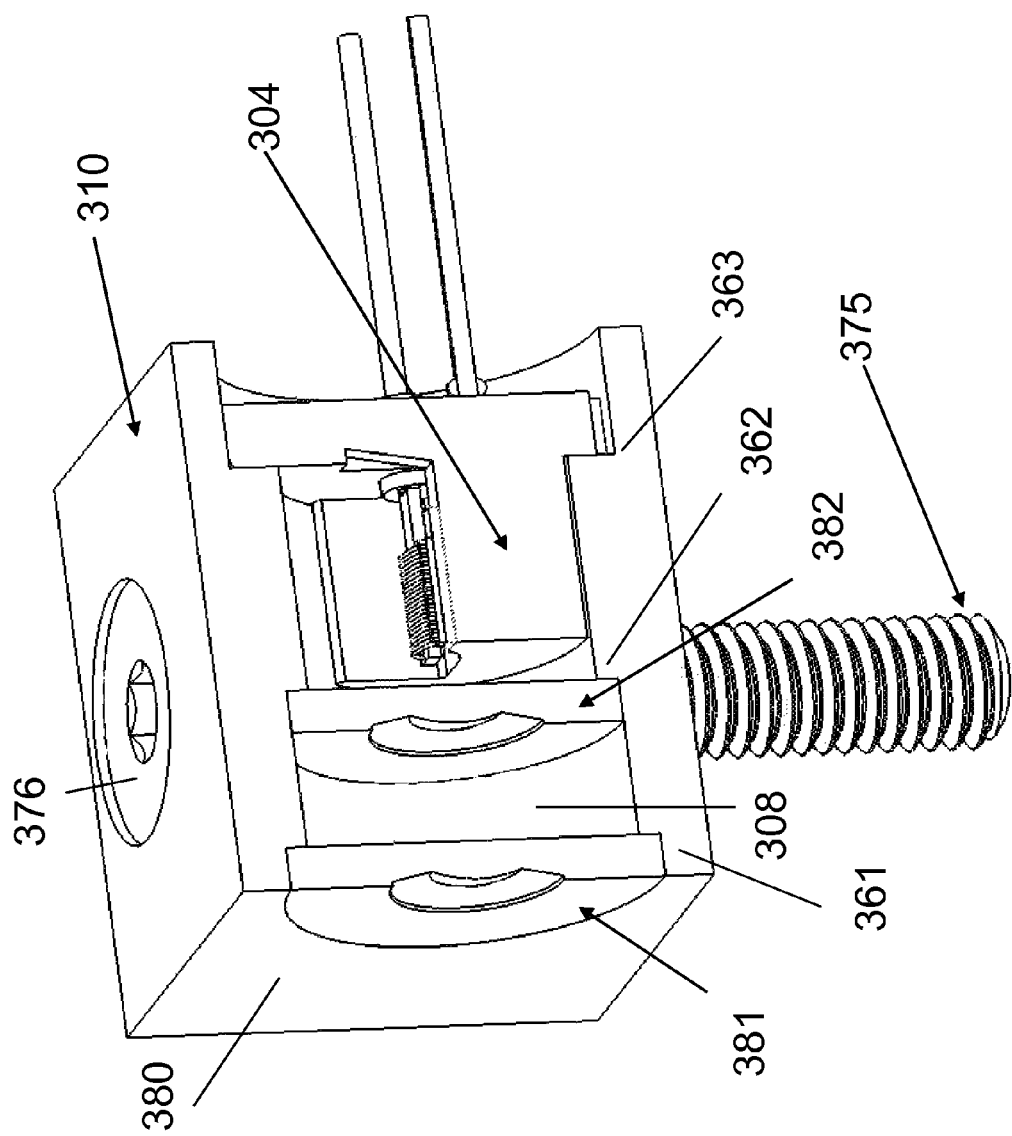

FIGS. 9 and 10 show a different style of assembly, especially suitable when removal of heat by flowing air is not required, so that the assembly need not be designed with internal air or other fluid cooling or conductive cooling. FIG. 9 is a perspective view, and FIG. 10 is a cross-sectional view. A laser package assembly 304 is similar to assemblies 104, 204 in the previous embodiments. The assembly 304 is held in a box-like heat exchanger enclosure 310 having a central bore 308. The enclosure 310 also includes a pair of bolts 375 with hex screw tops 376, which are shown as placed in the box in FIG. 9, and as bolted into a heat sink (not shown) in FIG. 10 (cross-section), which may also serve to carry heat away from the block enclosure 310. The heat exchanger enclosure 310 is designed to have two lenses, 381 and 382, rather than a single lens as in previous embodiments, but can have only one lens. The central bore 308 has three indents 361, 362, and 363 (see FIG. 10) for providing reliable stops for the lenses and the assembly 304. The assembly will typically be provided with a mechanical notch and spline, as in FIG. 4 (not shown). The rectangular profile of the heat exchanger enclosure 310 combined with the oriented screws 375 will provide orientation for the assembly as a whole.

Two lenses, 381 and 382 are shown in FIGS. 9 and 10. The division of the optical functions into two lenses may simplify the construction and increase the reliability of the lens orientation, in this or other embodiments. In particular, the outer lens 381 may serve to focus the laser output on a target. Fiducial mechanisms for orienting the lenses may be provided. The slightly differing lens diameters in these figures provide a means for insuring proper lens installation sequence.

Figure 11:
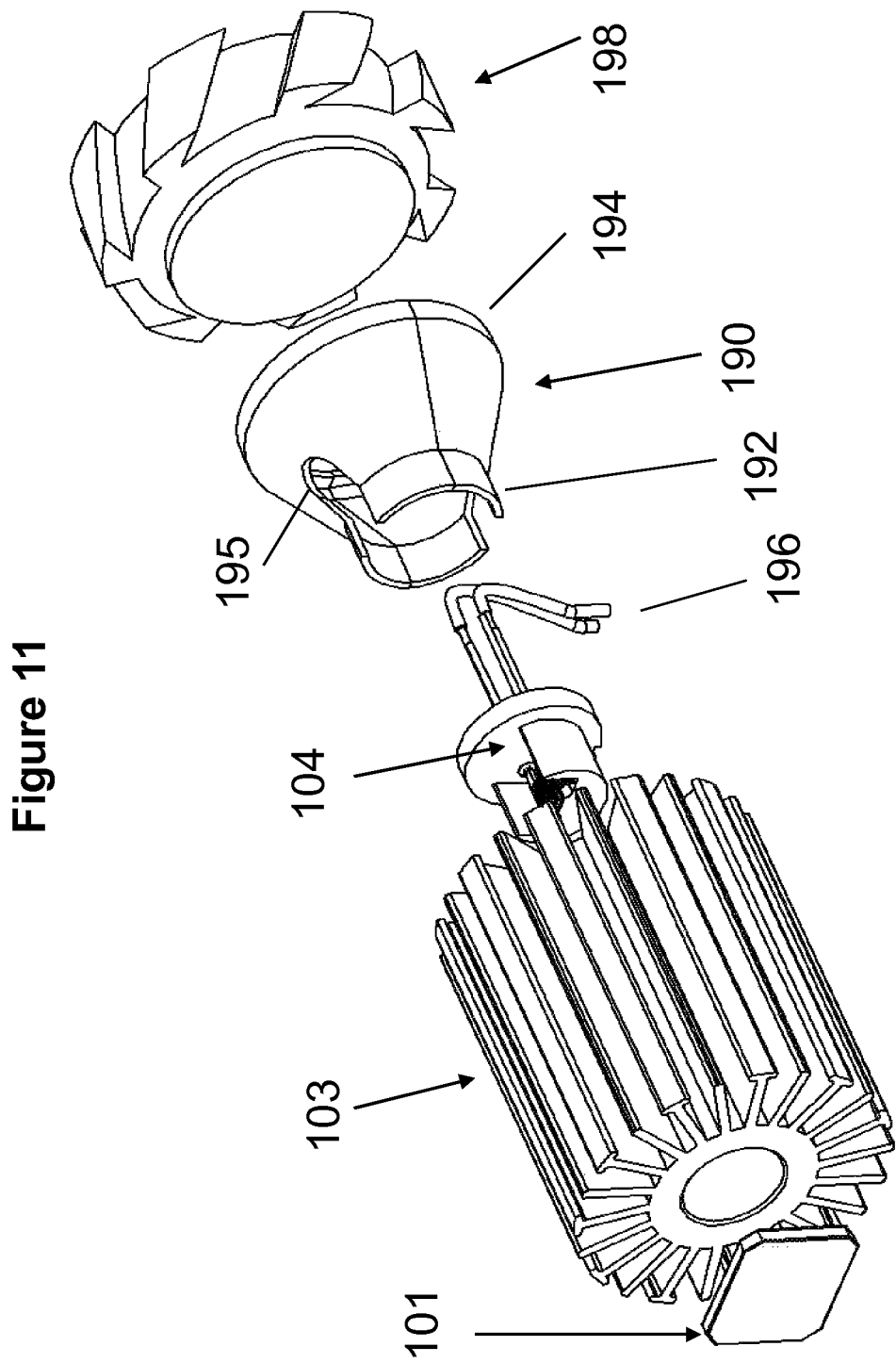
FIG. 11 shows the instrument of FIG. 1 or 7 with an attachable cooling fan.

The designs shown here use conductive cooling or convective cooling. Other cooling methods may be used. FIG. 11 shows the addition of a cooling fan to the system. To a device of FIG. 1, having a lens 101, a heat exchanger 103 and a TO-can style laser/electronics carrier 104, an adapter 190 is be added in some implementations. The adapter 190 has a first, proximal end 192 sized to fit into or onto the distal end of the heat exchanger 103, and has a slot 195 or other provision for connection to power leads 196. The adapter 190 has a second, distal end 194, adapted to fit into or onto a prepackaged fan 198. Thus, an accessory, such as a fan and/or another add-on, can readily be added in assembly of a final product, as well as having the option, as shown here, to be supplied as a post-fabrication accessory for the laser.

Figure 12:
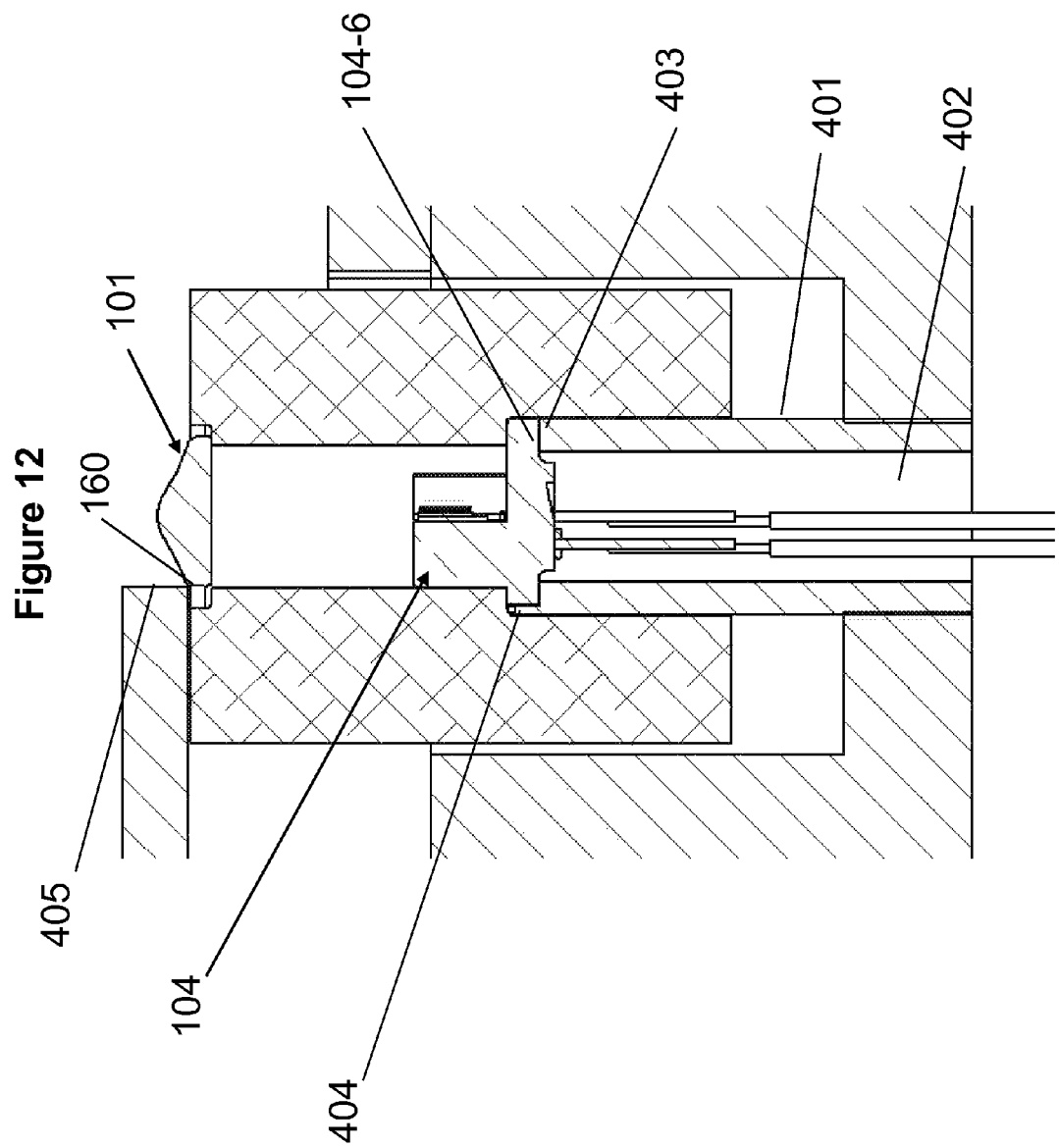
FIGS. 12 and 13 show an example of methods that passively align the embodiments of a laser engine
Figure 13:
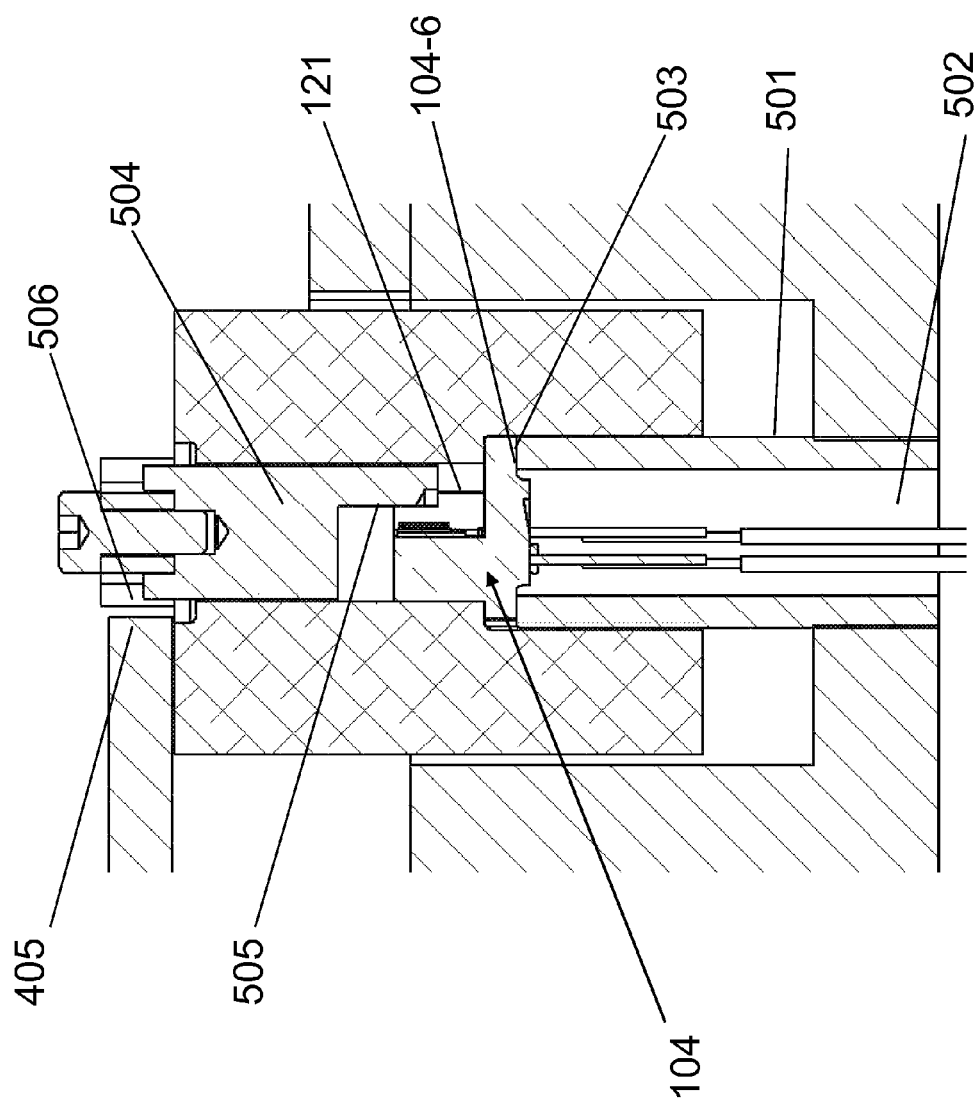

FIGS. 12 and 13 are cross sectional views that show two potential methods for passively aligning the embodiments of a laser engine. In FIG. 12 the laser package assembly 104 fits onto a pedestal 401 that contains a thru hole 402 and a top face 403. A key feature 404 aligns with the notch 138. Face 104-6 of laser package assembly 104 sits flushly on top face 403. Edge face 405 is used to align edge face 160 of lens 101.

In FIG. 13 the laser package assembly 104 fits onto a pedestal 501 that contains a thru hole 502 and a top face 503. The face 104-6 of laser package assembly 104 sits flushly on top face 503. A key feature 504 fits into the central channel 108 of the heat exchanger 103. Edge face 506 of the key feature 504 aligns with edge face 405. Face 505 is used to align the laser package assembly 104 by fitting closely to extensions 121. Once the laser package assembly 104 is aligned to heat exchanger 103, key feature 504 is removed from the central channel 108. Edge face 405 is used to align edge face 160 of lens 101, similar to what is shown in FIG. 12

Figure 14:
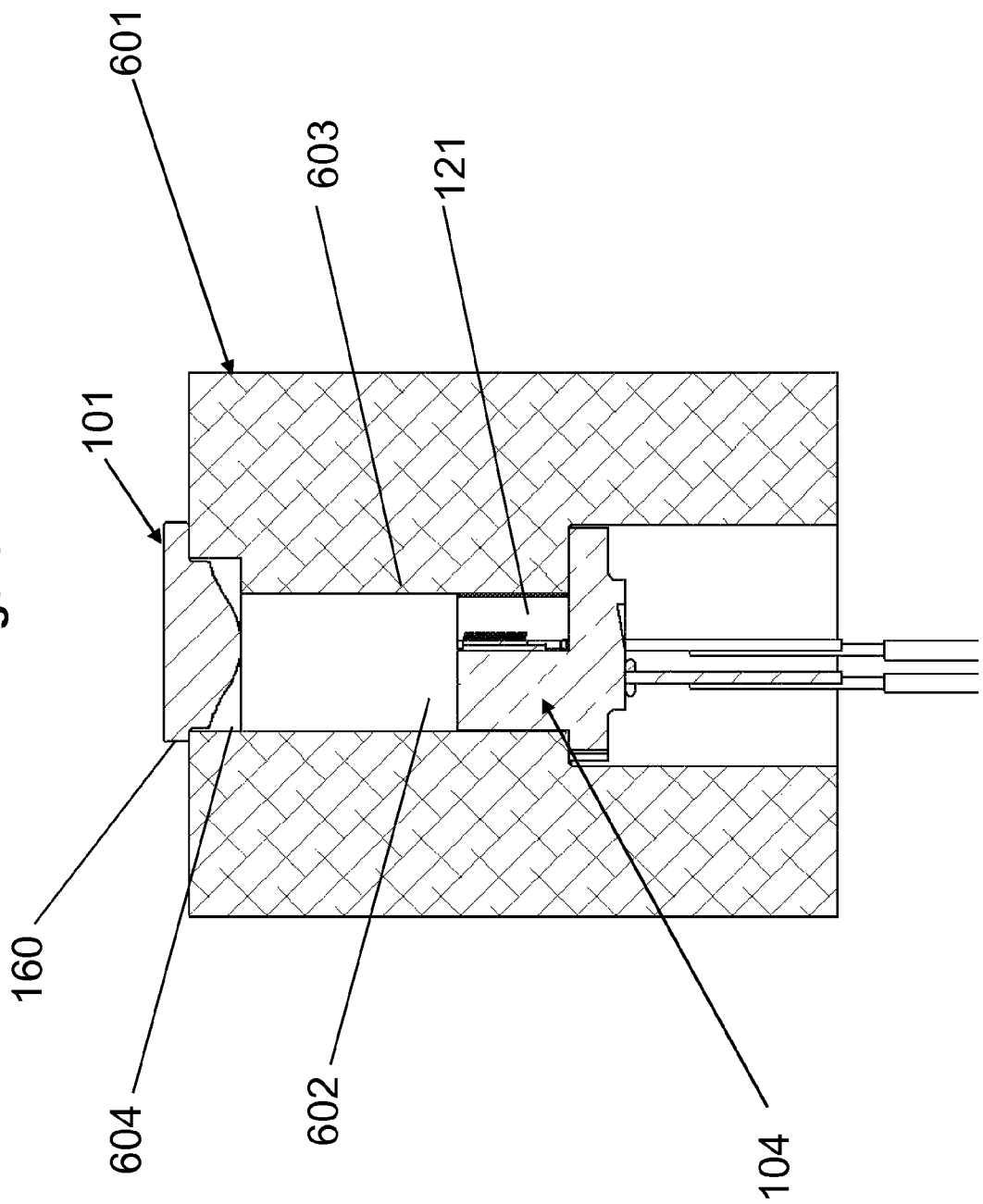
FIG. 14 shows a method of a self-aligning laser engine.

FIG. 14 shows a cross sectional view of a method for self aligning the embodiments of a laser engine. Heat sink 601 is similar to 103 except that central channel 602 extends towards the extensions 121 by a distance which limits the range of movement of unit 104 and allows laser package assembly 104 to fit in one direction. This allows 104 to self align to 601. Face 603 is used to align the laser package assembly 104 by fitting closely to extensions 121. Pedestal 153 of lens 101 fits into the lens channel 604 of the heat exchanger 601. Edge face 160 is used to align the lens 101 with respect to heat exchanger 601 and laser package assembly 104.

Figure 15:
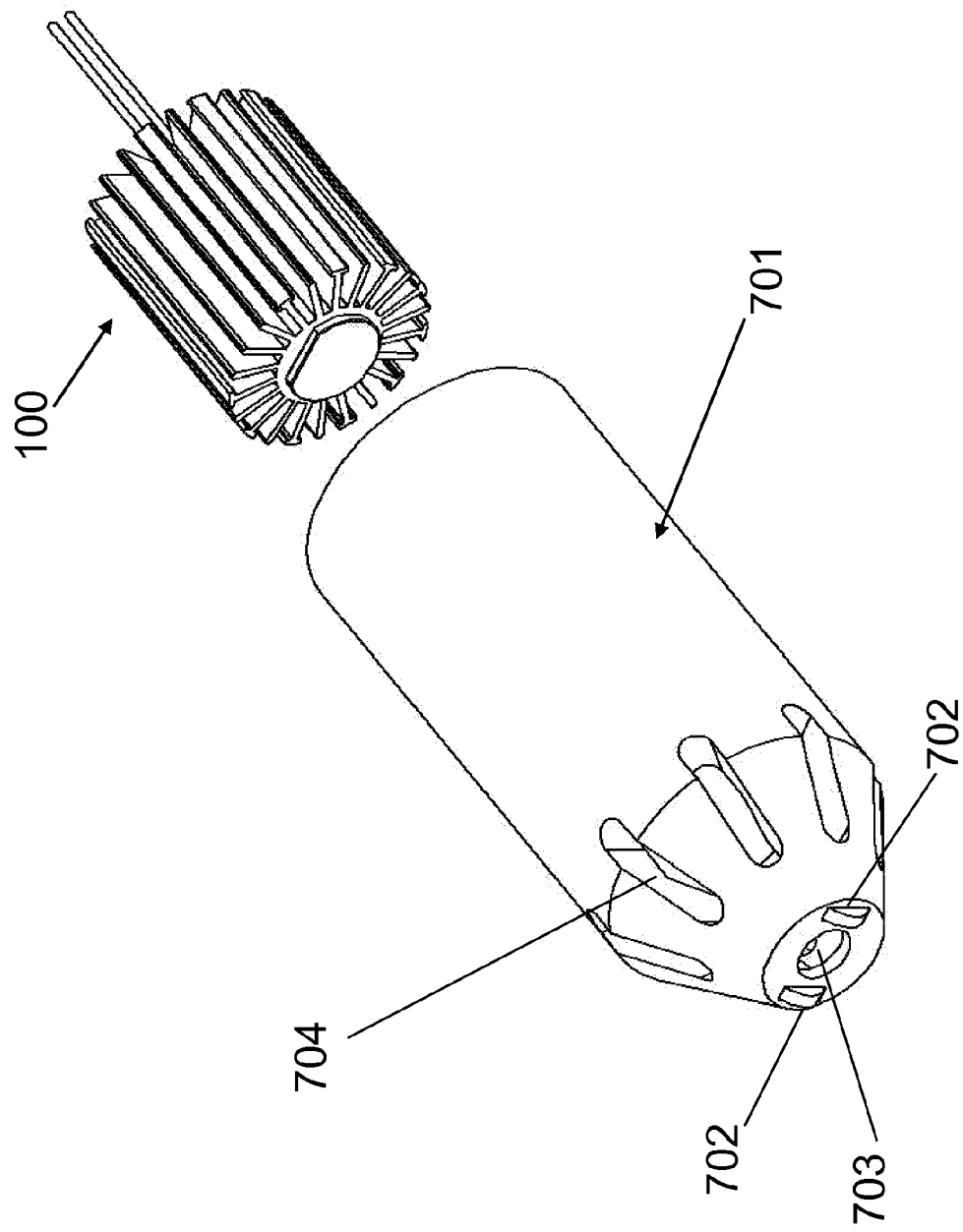
FIG. 15 shows a perspective view of a housing system for enclosing an assembled laser engine with an embedded a sensor system.

FIG. 15 and FIG. 16 show prospective views of housing system for a laser engine. In FIG. 15 the housing 701 is designed to fit a fully assembled laser system 100. The housing 701 has an exit window 703 to allow the laser light to pass through, a series of vents 704 to allow for the passage of air, and a sensor system including one or more contacts, illustrated in this case by two contact wheels 702. The sensor system is configured with the laser system 100 to act as a safety mechanism. The purpose of the sensor system is to detect pressure and motion in order to prevent the end user from unnecessary exposure to the laser light. In this case the contact wheels 702 or the spherical contact 712 from FIG. 16 first act as a pressure sensor to confirm that the device is in contact with a treatment zone, such as the patient's skin, and second to act as a motion sensor to confirm that the device has been moved from the initial treatment zone by a certain distance to prevent damage from over exposure of the laser light. The contacts are preferably also used to control the emission from the laser assembly. An electrical signal is generated which is proportional to the amount of pressure and/or rotation from the contacts. The electrical signal is then be processed and used as a means for controlling the emission from the laser assembly.

Emission from the laser assembly 100 is controlled through the use of a control system which takes electrical input from the sensors 702 and generates an electrical signal which is applied to the laser assembly 100. FIG. 17 shows a block diagram of the housing and controls illustrated in FIGS. 15 and 16. Housing 701 contains the laser engine 100, control system 721, sensor system 702 and power supply 722. The sensor system 702 is connected to the control system 721 by wiring. The control system 721 is connected to the laser assembly via a separate set of wiring.

In one implementation, when the sensor system 702 is activated either by pressure or by movement, an electrical signal is passed to the control system which then creates a different electrical signal which energizes the laser assembly and permits emission. The resultant emission from the laser assembly is usually either continuous or pulsed or a combination of both. The control board in FIG. 17 is designed such that electrical feedback from the sensor system 702 is used to create an electrical signal which when applied to the laser assembly an emission pattern is created which is a function of the feedback. In one embodiment, 702 creates an electrical signal which is proportional to rate at which the housing 701 is moved. The electrical signal is transmitted to and processed by the control board 721. The control board then outputs a continuous electrical signal to the laser engine which emits during the time motion is sensed.

The control board is also be used to supply a signal to the laser assembly 100 which is proportional to the signal received from the sensor system 702 which is created when the housing 701 is in contact with an object and is moved. When the sensor system 702 is placed in contact with an object and the housing 701 is moved, the sensor systems detects the rate of or change in motion and creates an electrical signal which is proportional to the rate or change in motion. The signal is passed to the control board 721. For certain applications, the control board 721 outputs a pulsed electrical signal to the laser assembly 100 whose time on and or repetition rate is adjusted in proportion to the rate of movement during the time which motion is sensed. In other applications, the control board 721 outputs a constant electrical signal to the laser assembly 100 only when motion is sensed.

A system as shown in FIGS. 15 and 16 has application in using a laser against the skin for treating wrinkles, acne, warts, skin cancer and/or other skin diseases. In one embodiment the fan blows air to cool the laser diode heat sink and the same fan air also cools the skin near and/or on the spot of tissue being treated with laser light. The lens in all embodiments is ideally designed to provide relatively uniform light on the surface of the target tissue such that there are no hot spots that will burn the tissue. Another embodiment incorporates a detractive lens to split the light into many discrete elements (or "dots" of light) to treat the tissue in some areas while leaving adjacent areas without significant treatment thereby allowing for faster healing of the tissue and limited burning. The rolling elements of FIGS. 15 and 16 is used to trigger the laser to fire such that the skin is treated uniformly with a controlled amount of overlap of light pulse areas. This rolling element approach benefits the user because a large area of skin may be treated quickly as the laser fires automatically as new skin is presented to the laser tip. This allows the user to simply roll the device around the contours of their skin and treat areas with multiple smooth passes. In one embodiment, the rotating wheel is designed to only rotate in one direction, which prevents the laser from rolling back on skin that has recently been treated with the laser. This prevents a double treatment of given tissue which is typically undesirable because it can lead to pain and redness of the tissue. In another embodiment, the lenses are designed to create a sharp point of light of 500 um or less in diameter to create a concentrated light source that cuts tissue and coagulates the edges of the cut at the same time. In another embodiment, the laser lens is designed to achieve a spot that does not cut tissue, but coagulates a relatively large area of tissue such as a diameter of 5 to 10 mm.

Other Embodiments and Features

Many options and variants are available. In one embodiment, as shown, a fan is provided to blow air across the heat exchanger associated with a laser package, for example the fins of the device of FIG. 1. The fan is fixed to the apparatus by a clip, or a set screw, or a press fit. In the embodiment of FIG. 11, a fan is affixed "behind" the laser chip, with respect to the downstream optics, and blows or pulls air across the chip or its carrier. Such an arrangement makes minimal change to the device profile.

The lasers themselves and many of the components of the system are described above, or are known, and a variety of standard materials and components are used to make the inventive devices.

Solders for mounting the chip are preferably gold-tin or indium. Other materials include gold-germanium, tin-silver, tin-silver-copper, bismuth-tin, or binary or tertiary alloys of these materials.

A submount, if used, is usually made of aluminum nitride (preferred) or pure copper or copper/tungsten or beryllium oxide or aluminum oxide. Ideally, no submount at all is used, and the laser chip is mounted directly onto the heat sink, preferably using a soft solder such as indium to allow for thermal mismatch.

The TO-style carrier (104, etc) is preferably copper, but other materials can be used, including aluminum, cold-rolled steel and nickel-cobalt ferrous alloy such a Kovar brand alloy.

Wire bonds: If an electrically insulative submount is used, such as aluminum nitride, then wire bonds 132 are required from the submount base (e.g., 126 in FIG. 4) to the copper lead to post 106. If the chip is mounted directly onto pedestal 124, then only one set of wire bonds, e.g. 130 in FIG. 4, are needed from the top surface of the chip to a lead pin. Wire bonds are made of conventional materials, such as copper, aluminum or gold.

Heat sink: The heat sink is preferably made of aluminum for good thermal dissipation, and optionally is black anodized to further maximize heat radiation dissipation. Copper may also be used, as well as other conventional heat sink materials.

Size of assembly: The laser system is preferably less than 2 inches in diameter and less than 6 inches long so it is portable and lightweight.

Leads material: cobalt-iron alloy material is preferred for devices which will carry a current of 4 Amps or more in many applications. In contrast, a standard industry type pin lead of 0.45 millimeters (mm) diameter made of conventional materials such as copper or Kovar alloy is likely to have thermal, mechanical and/or electrical breakdown at 4 Amps or more of current.

The particular style of the carrier, shown as a TO-can style herein, is not critical, and various proportions and shapes of the body, and different arrangements of the body and of other parts having similar functions are contemplated. Other TO-can embodiments include a square or rectangular mount which omit the extensions 121 and may have a curved shape opposite the surface to which the laser is mounted. Other embodiments may include more or fewer leads which pass through the base.

Unless defined otherwise, all technical and scientific terms used herein have the same meanings as commonly understood by one of skill in the art to which the disclosed invention belongs. Although any methods and materials similar or equivalent to those described herein can be used in the practice or testing of the present invention, the preferred methods, devices, and materials are as described. Publications cited herein and the material for which they are cited are specifically incorporated by reference, where such incorporation is permitted. Nothing herein is to be construed as an admission that the invention is not entitled to antedate such disclosure by virtue of prior invention, where relevant. Those skilled in the art will recognize, or be able to ascertain using no more than routine experimentation, many equivalents to the specific embodiments of the invention described herein. Such equivalents are intended to be encompassed by the following claims.

What is claimed is:

1. A method for assembling high powered semiconductor laser systems to provide lasers which are passively or self-aligned and have predefined focal points or imaging planes without post-fabrication adjustment, wherein the method comprises:
affixing a semiconductor laser chip to a carrier; said carrier having power connections, a base, and a heat spreading mount that projects from the base;
placing said carrier into a heat-exchanging relationship with a heat exchanger by inserting the carrier, which includes the semiconductor laser chip, into a bore in the heat exchanger, the bore having a larger diameter section and a smaller diameter section that receives the heat spreading mount, whereby said heat exchanger and said carrier are passively or self aligned into an efficient heat exchanging contact;
affixing an optical element to one or both of said heat exchanger for said lasers, and said carrier, wherein said laser systems produced by said method have at least one output laser beam from each semiconductor laser chip, each beam having a predefined direction of propagation without post-fabrication adjustment; and
inserting the heat exchanger into a housing that surrounds the heat exchanger, wherein the housing includes vents to allow the passage of air over the heat-exchanger and through the housing.

2. The method of assembling of claim 1, wherein said mount sets the depth of engagement with the heat exchanger.

3. The method of assembling of claim 1, wherein an outer surface of the mount and an inner surface of said bore are constructed to create close proximity between their surfaces, upon assembly, to allow efficient heat transfer between said laser diode and said heat exchanger.

4. The method of assembling of claim 1, wherein said laser chip is mounted onto a heat-spreading pedestal portion of said mount.

5. The method of assembling of claim 1, wherein components are mutually self-aligned at least in part by their radial centering within a cavity in at least one component.

6. The method of assembling of claim 1, wherein a fan is attached to said laser systems said system to increase heat removal.

7. The method of assembling of claim 1, wherein each component which is not functionally rotationally symmetric is self-aligning during the assembly process so as to be joined in a predetermined rotational position with respect to the rest of the system.

8. The method of assembling of claim 1, wherein said mount has peripheral extensions functioning as heat spreaders to increase the heat transfer rate between the mount and the heat exchanger.

9. The method of assembling of claim 8, wherein the mount plus said peripheral extensions subtend an angle of at least about 200 degrees with respect to the central axis of said carrier.

10. The method of assembling of claim 1, wherein positioning of the heat exchanger and the carrier is obtained by the use of detents.

11. The method of assembling of claim 1, wherein fins projecting outwardly from the center of said laser systems are provided to increase the efficiency of heat exchange or removal.

12. The method of assembling of claim 11, wherein at least some of said fins have T-shaped terminations to increase the rate of heat removal.

13. The method of assembling of claim 11, wherein said method further comprises a basis for clocking by providing at least one of said fins to be distinguishable from other fins in shape or location.

14. The method of assembling of claim 1, further comprising increasing heat removal by providing an adaptor for connecting a fan to said laser systems.

15. The method of assembling of claim 1, wherein alignment of said carrier, said heat exchanger, and at least one optical element, is achieved by clocking.

16. The method of assembling of claim 1 wherein the optical element is at least one lens, which is aspheric, cylindrical or toric.

17. The method of assembling of claim 1, wherein a laser facet is centered in said laser systems when the assembly is completed by affixing said lasers to a location on said carrier in a location that will be centered after the mutual alignment of said carrier and said heat exchanger.

18. The method of assembling of claim 1, wherein said mount is assembled so as to be thermally mated to a cavity inside a heat removal element that is fastened to an apparatus.

19. The method of assembling of claim 1, wherein the housing includes an exit window through which the beam exits.

20. The method of assembling of claim 1, further comprising a fan to blow air over fins of the heat exchanger and through the vents.

21. A method for assembling semiconductor laser systems to provide lasers which are self-aligned and have predefined focal distances or imaging planes, without post-fabrication adjustment, wherein the method comprises:
affixing a semiconductor laser chip to a carrier, which comprises a base and a heat spreading mount that projects from the base;
placing said carrier into a heat-exchanging relationship with a heat exchanger by inserting the carrier, which includes the semiconductor laser chip, into a bore in the heat exchanger, the bore having a larger diameter section and a smaller diameter section that receives the heat spreading mount, wherein said heat exchanger and said carrier are self aligning into a heat exchanging contact; and inserting the heat exchanger into a housing that surrounds the heat exchanger, the housing including vents to allow the passage of air over the heat-exchanger and through the housing.

22. A method for assembling a high powered semiconductor laser system to provide a laser which is passively or self-aligned and has a predefined focal point or imaging plane without post-fabrication adjustment, wherein the method comprises:

affixing a semiconductor laser chip to a carrier; said carrier having power connections, a base, and a heat spreading mount that projects from the base;

placing said carrier into a heat-exchanging relationship with a heat exchanger by inserting the carrier, which includes the semiconductor laser chip, into a bore in the heat exchanger, the bore having a larger diameter section and a smaller diameter section that receives the heat spreading mount, whereby said heat exchanger and said carrier are passively or self aligning into an efficient heat exchanging contact;

affixing an optical element to one or both of said heat exchanger for said laser, and said carrier;

inserting the heat exchanger into a housing that surrounds the heat exchanger, the housing including vents to allow the passage of air over the heat-exchanger and through the housing; and wherein said laser system produced by said method has at least one output laser beam from said semiconductor laser chip, each beam having a predefined direction of propagation without post-fabrication adjustment.

\* \* \* \* \*